(12) United States Patent
Appelt

(10) Patent No.: US 10,229,892 B2
(45) Date of Patent: Mar. 12, 2019

(54) SEMICONDUCTOR PACKAGE AND METHOD FOR MANUFACTURING A SEMICONDUCTOR PACKAGE

(71) Applicant: Advanced Semiconductor Engineering, Inc., Kaohsiung (TW)

(72) Inventor: Bernd Karl Appelt, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/636,339

(22) Filed: Jun. 28, 2017

(65) Prior Publication Data

US 2019/0006308 A1  Jan. 3, 2019

(51) Int. Cl.
*H01L 23/00* (2006.01)
*H01L 23/31* (2006.01)
(Continued)

(52) U.S. Cl.
CPC ............ *H01L 24/24* (2013.01); *H01L 21/568* (2013.01); *H01L 21/6835* (2013.01); *H01L 23/3114* (2013.01); *H01L 23/5389* (2013.01); *H01L 24/04* (2013.01); *H01L 24/19* (2013.01); *H01L 24/20* (2013.01); *H01L 24/25* (2013.01); *H01L 25/0657* (2013.01); *H01L 2221/68359* (2013.01); *H01L 2224/04105* (2013.01); *H01L 2224/211* (2013.01); *H01L 2224/24105* (2013.01); *H01L 2224/25171* (2013.01); *H01L 2224/73209* (2013.01); *H01L 2224/73217* (2013.01); *H01L 2224/73259* (2013.01); *H01L 2224/73267* (2013.01);
(Continued)

(58) Field of Classification Search
CPC .......... H01L 23/49827; H01L 23/3114; H01L 25/0657; H01L 2224/1134; H01L 2225/06541; H01L 23/5384; H01L 24/25; H01L 24/24; H01L 2224/04105; H01L 2224/73209; H01L 2224/73267; H01L 21/568; H01L 24/20; H01L 2225/0652; H01L 23/3121; H01L 2924/181; H01L 21/565; H01L 2224/24105; H01L 2224/25171; H01L 2224/3209; H01L 2224/73217; H01L 23/5389; H01L 24/04; H91L 2224/73259

See application file for complete search history.

(56) References Cited

U.S. PATENT DOCUMENTS 8,174,119 B2  5/2012  Pendse
8,330,279 B2  12/2012  Miki
(Continued)

*Primary Examiner* — Jasmine Clark
(74) *Attorney, Agent, or Firm* — Foley & Lardner LLP; Cliff Z. Liu

(57) ABSTRACT

A semiconductor package includes at least one semiconductor element, an encapsulant, a first circuitry, a second circuitry and at least one first stud bump. The encapsulant covers at least a portion of the semiconductor element. The encapsulant has a first surface and a second surface opposite to the first surface. The first circuitry is disposed adjacent to the first surface of the encapsulant. The second circuitry is disposed adjacent to the second surface of the encapsulant. The first stud bump is disposed in the encapsulant, and electrically connects the first circuitry and the second circuitry. The first stud bump contacts the second circuitry directly.

35 Claims, 33 Drawing Sheets

(51) Int. Cl.
*H01L 25/065* (2006.01)
*H01L 23/538* (2006.01)
*H01L 21/683* (2006.01)
*H01L 21/56* (2006.01)

(52) U.S. Cl.
CPC ........... *H01L 2225/0652* (2013.01); *H01L 2225/06506* (2013.01); *H01L 2225/06548* (2013.01)

(56) References Cited

U.S. PATENT DOCUMENTS

| | | |
|---|---|---|
| 8,618,659 B2 | 12/2013 | Sato et al. |
| 9,263,361 B2 | 2/2016 | Pagaila et al. |
| 2006/0216868 A1 | 9/2006 | Yang et al. |
| 2006/0258139 A1 | 11/2006 | Iijima et al. |
| 2009/0014858 A1* | 1/2009 | Boon ............... H01L 23/5283 257/686 |
| 2011/0049695 A1* | 3/2011 | Shin ................. H01L 21/561 257/686 |
| 2016/0118333 A1* | 4/2016 | Lin .................. H01L 24/97 257/773 |
| 2017/0162476 A1* | 6/2017 | Meyer ............... H01L 21/78 |

* cited by examiner

SEMICONDUCTOR PACKAGE AND METHOD FOR MANUFACTURING A SEMICONDUCTOR PACKAGE

BACKGROUND

1. Field of the Disclosure

The present disclosure relates to a semiconductor package and a semiconductor process, and more particularly, to a semiconductor package including at least one stud bump disposed in an encapsulant and a semiconductor process for manufacturing the same.

2. Description of the Related Art

In some semiconductor packages, a top circuitry and/or a bottom circuitry may be disposed outside of an encapsulant. Conductive vias extending through the encapsulant electrically connect the top circuitry and/or the bottom circuitry to electronic components inside of the encapsulant. The conductive vias may be formed by drilling the encapsulant and plating a metal material in the drilled holes. However, such techniques increase the difficulty and cost of a manufacturing process.

SUMMARY

In one aspect according to some embodiments, a semiconductor package includes at least one semiconductor element, an encapsulant, a first circuitry, a second circuitry and at least one first stud bump. The encapsulant covers at least a portion of the semiconductor element. The encapsulant has a first surface and a second surface opposite to the first surface. The first circuitry is disposed adjacent to the first surface of the encapsulant. The second circuitry is disposed adjacent to a second surface of the encapsulant. The first stud bump is disposed in the encapsulant, and electrically connects the first circuitry and the second circuitry. The first stud bump contacts the second circuitry directly.

In another aspect according to some embodiments, a semiconductor package includes at least one semiconductor element, an encapsulant, a first circuitry and a second circuitry. The encapsulant covers at least a portion of the semiconductor element. The encapsulant has a first surface and a second surface opposite to the first surface. The first circuitry is disposed adjacent to the first surface of the encapsulant. The second circuitry is disposed adjacent to the second surface of the encapsulant, and is electrically connected to the first circuitry. The second circuitry includes a base layer formed from a metal sheet.

In another aspect according to some embodiments, a method for manufacturing a semiconductor package, comprising: (a) disposing a metal sheet on a carrier; (b) attaching at least one semiconductor element to the metal sheet; (c) forming at least one first stud bump on the metal sheet; (d) forming an encapsulant to cover at least a portion of the semiconductor element and the first stud bump; (e) removing the carrier; and (f) patterning at least a portion of the metal sheet.

BRIEF DESCRIPTION OF THE DRAWINGS

Aspects of some embodiments of the present disclosure are best understood from the following detailed description when read with the accompanying figures. It is noted that various structures may not be drawn to scale, and dimensions of the various structures may be arbitrarily increased or reduced for clarity of discussion.

Figure 1:
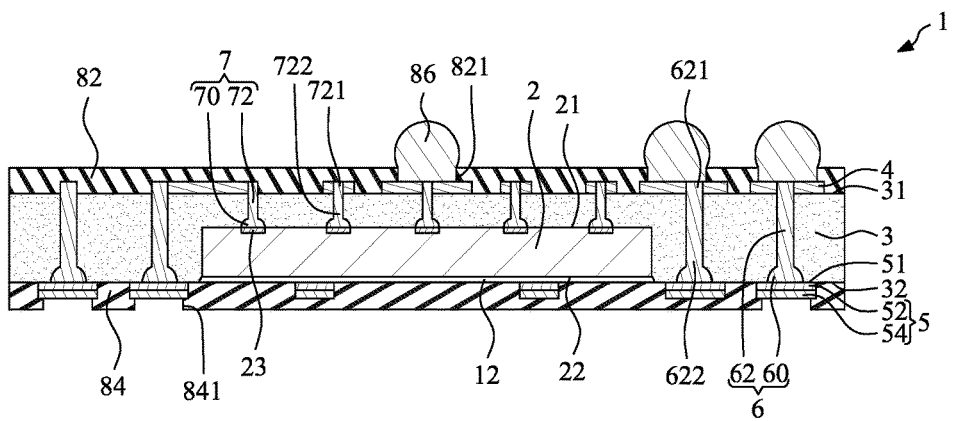
FIG. 1 depicts a cross-sectional view of an example of a semiconductor package according to some embodiments of the present disclosure.

Common reference numerals are used throughout the drawings and the detailed description to indicate the same or similar components. The present disclosure can be best understood from the following detailed description taken in conjunction with the accompanying drawings.

DETAILED DESCRIPTION

In a semiconductor package including a semiconductor die and/or one or more electronic components (e.g., passive components), an encapsulant can be formed to cover the semiconductor die and/or the electronic components. A top circuitry may be formed on a top surface of the encapsulant. The top circuitry is electrically connected to the semiconductor die and/or the electronic components by a plurality of first conductive interconnectors so as to form a fan-out wafer level package. In order to increase a number of external connections, a bottom circuitry may be formed on the bottom surface of the encapsulant. The bottom circuitry is electrically connected to the top circuitry by a plurality of second conductive interconnectors. The first conductive interconnectors and/or the second conductive interconnectors may be conductive vias (e.g., vias of pillar type). The conductive vias may be formed by drilling the encapsulant to form a plurality of through holes extending through the encapsulant and then plating a metal material in the through holes. However, such techniques of forming the conductive vias increase the difficulty and cost of a manufacturing process. Further, the top circuitry and/or the bottom circuitry may be formed by forming a seed layer on a surface of the encapsulant, pattern-plating a metal layer on the seed layer, and flash-etching the seed layer. It is noted that such techniques also increase the difficulty and cost of a manufacturing process. It is therefore desirable to develop a semiconductor package and a semiconductor process to address the above issues.

Described in the present disclosure are embodiments of a semiconductor package that includes one or more stud bumps as conductive interconnector(s). In some embodiments, a top circuitry on a top surface of an encapsulant of the semiconductor package is electrically connected to a semiconductor die and/or one or more electronic components inside of the encapsulant by a plurality of first stud bumps so as to form a fan-out wafer level package. A bottom circuitry on a bottom surface of the encapsulant is electrically connected to the top circuitry by a plurality of second stud bumps. The first stud bumps and/or the second stud bumps may be formed by, e.g., wire bonding apparatus. Thus, the difficulty and cost of a manufacturing process is reduced. In addition, the top circuitry and/or the bottom circuitry may be formed by patterning a metal sheet that the semiconductor die and/or the electronic components and the encapsulant are disposed on at initial stages of the manufacturing process. That is, the metal sheet provided at the initial stages may be not removed completely during later stages of the manufacturing process, and at least a portion of the metal sheet may remain in the final product. In other words, the top circuitry and/or the bottom circuitry may include at least a portion of the patterned metal sheet. Thus, the difficulty and cost of a manufacturing process is further reduced.

FIG. 1 depicts a cross-sectional view of an example of a semiconductor package 1 according to some embodiments of the present disclosure. The semiconductor package 1 includes at least one semiconductor element 2, an encapsulant 3, an adhesive layer 12, a first circuitry 4, a second circuitry 5, at least one first stud bump 6, at least one conductive interconnector (e.g., second stud bump 7), a first protection layer 82, a second protection layer 84 and at least one external connector (e.g., solder bump 86).

The semiconductor element 2 may be, e.g., a semiconductor die or an electronic component (e.g., passive component). The semiconductor element 2 has an active surface 21, a backside surface 22 opposite to the active surface 21 and a plurality of pads 23. The active surface 21 faces upward with reference to the orientation shown in FIG. 1. The backside surface 22 may be covered by the adhesive layer 12, and faces downward with reference to the orientation shown in FIG. 1. The pads 23 are disposed adjacent to the active surface 21 of the semiconductor element 2.

The encapsulant 3 covers or encapsulates at least a portion of the semiconductor element 2. The term of covering an object or encapsulating an object, as used herein, means enclosing or surrounding at least a portion of the object, such as covering at least all or some of the lateral sides of the object. A material of the encapsulant 3 may include a molding compound (such as epoxy resin with fillers), a photo-imageable dielectric (such as solder mask or other suitable dielectric materials), or a combination thereof. The encapsulant 3 has a first surface 31 and a second surface 32 opposite to the first surface 31. As shown in FIG. 1, the encapsulant 3 covers at least a portion of the active surface 21 of the semiconductor element 2, the lateral surface of the semiconductor element 2, the first stud bump 6 and the conductive interconnector (e.g., second stud bump 7). Thus, the semiconductor element 2 is embedded at least in part in the encapsulant 3. The thickness of the semiconductor element 2 is less than the thickness of the encapsulant 3. In one embodiment, the active surface 21 of the semiconductor element 2 faces toward the first surface 31 of the encapsulant 3. The backside surface 22 of the semiconductor element 2 is disposed adjacent to the second surface 32 of the encapsulant 3. It is noted that the bottom surface of the adhesive layer 12 may be substantially coplanar with the second surface 32 of the encapsulant 3.

The first circuitry 4 (e.g., a redistribution layer (RDL); also referred to as top circuitry) is disposed adjacent to the first surface 31 of the encapsulant 3. As shown in FIG. 1, the first circuitry 4 is disposed on and contacts the first surface 31 of the encapsulant 3. The first circuitry 4 is disposed above the active surface 21 of the semiconductor element 2. Thus, the active surface 21 of the semiconductor element 2 faces the first circuitry 4. It is noted that the first circuitry 4 may include a plurality of fan-out traces and/or a plurality of bump pads that are formed by, for example, plating or ink jet printing. In one embodiment, the first circuitry 4 may be formed by forming a seed layer on the first surface 31 of the encapsulant 3, pattern-plating a metal layer on the seed layer, and flash-etching the seed layer. The material of the seed layer may be or include, e.g., titanium-copper (TiCu), and the material of the plated metal layer may be or include, e.g., Cu.

The second circuitry 5 (e.g., a redistribution layer (RDL); also referred to as bottom circuitry) is disposed adjacent to the second surface 32 of the encapsulant 3, and is electrically connected to the first circuitry 4. As shown in FIG. 1, the second circuitry 5 is disposed on and contacts the second surface 32 of the encapsulant 3. The second circuitry 5 is disposed under the backside surface 22 of the semiconductor element 2. Thus, the backside surface 22 of the semiconductor element 2 faces the second circuitry 5. The adhesive layer 12 may be interposed between the backside surface 22 of the semiconductor element 2 and the second circuitry 5. Thus, at least in some embodiments, the backside surface 22 of the semiconductor element 2 may not be coplanar with the second surface 32 of the encapsulant 3.

The second circuitry 5 may be configured to include a plurality of traces and/or a plurality of bump pads. In one embodiment, the second circuitry 5 may include a base layer 52 and a surface layer 54. The surface layer 54 is disposed on the base layer 52. Thus, the base layer 52 is interposed between the surface layer 54 and the second surface 32 of the encapsulant 3. Alternatively, the base layer 52 may be interposed between the surface layer 54 and the adhesive layer 12. The base layer 52 may be formed from a metal sheet. In one embodiment, the second circuitry 5 may be formed by thinning a metal sheet, pattern-plating the surface layer 54 on the thinned metal sheet, and flash-etching the thinned metal sheet to become the base layer 52, so that the base layer 52 is patterned and is conformal with the surface layer 54. The metal sheet may be or include, e.g., a copper (Cu) foil. Thus, the base layer 52 may be a portion of the Cu foil. The surface layer 54 may be or include, e.g., plated Cu or other suitable material. The thickness of the base layer 52 may be, e.g., about 0.1 μm to about 200 about 0.5 μm to about 200 about 1 μm to about 100 or about 1.5 μm to about 50 μm.

The second circuitry 5 has a first surface 51 (e.g., the top surface of the base layer 52) contacting the second surface 32 of the encapsulant 3 and/or the bottom surface of the adhesive layer 12. A surface roughness (Rz) of the first surface 51 of the second circuitry 5 may be, e.g., about 0.1 μm to about 10.0 about 0.5 μm to about 5.0 or about 1.0 μm to about 3.0 μm. A uniformity of the first surface 51 of the second circuitry 5 may be less than, e.g., about 10%, about 8%, about 5%, or about 3%. In some embodiments, the uniformity may be determined or measured based on points of a surface. For example, multiple points (e.g., 5 points) of the surface may be selected randomly. A thickness of a layer or a film (e.g., thickness of the second circuitry 5) at each point is measured. Uniformity of the surface may be defined as, e.g., a difference between the maximal thickness and the minimal thickness, divided by twice an average of the thickness values at the selected points:

$$\text{uniformity} = \frac{x_{max} - x_{min}}{2 \times \overline{x_i}} \times 100\%.$$

A total thickness variation (TTV) of the first surface 51 of the second circuitry 5 may be less than, e.g., about 20 about 10 or about 5 In some embodiments, since the base layer 52 of the second circuitry 5 is formed by patterning a metal sheet, the surface condition of the first surface 51 (e.g., Rz, uniformity and/or TTV) may not depend upon the surface conditions of the second surface 32 of the encapsulant 3 and/or the bottom surface of the adhesive layer 12. Thus, the surface condition (e.g., Rz, uniformity and TTV) of the base layer 52 of the second circuitry 5 may be better than a surface condition of a plated or sputtered circuitry.

The first stud bump 6 is disposed in the encapsulant 3. That is, at least a portion of the first stud bump 6 is covered or encapsulated by the encapsulant 3. The first stud bump 6 electrically connects the first circuitry 4 and the second circuitry 5. The material of the first stud bump 6 may be or include, e.g., gold, copper, silver, platinum coated copper, a combination of two or more thereof, or another metal or combination of metals. As shown in FIG. 1, the first stud bump 6 contacts the second circuitry 5 directly. In one embodiment, the first stud bump 6 includes a stud portion 62 and a bump portion 60, wherein a width of the stud portion 62 is smaller than a width of the bump portion 60. It is noted that the stud portion 62 may be substantially in a pillar shape, and the bump portion 60 may be substantially in a disk shape. The stud portion 62 and the bump portion 60 may be formed concurrently and integrally by a wire bonding apparatus. The bump portion 60 of the first stud bump 6 contacts the second circuitry 5 directly. Since the first surface 51 of the second circuitry 5 has a suitable surface condition (e.g., Rz, uniformity and TTV), the bump portion 60 of the first stud bump 6 can be attached to the first surface 51 of the second circuitry 5 securely. That is, the bump portion 60 of the first stud bump 6 does not peel off from the first surface 51 of the second circuitry 5 easily. In comparison, a plated or sputtered circuitry may have an unsuitable surface condition since its surface condition may depend upon the surface conditions of the second surface 32 of the encapsulant 3 and/or the bottom surface of the adhesive layer 12. Thus, if a bump portion of a stud bump is attached to the surface of the plated or sputtered circuitry, the bump portion of the stud bump may peel off from the surface of the plated or sputtered circuitry easily.

The stud portion 62 includes a first end 621 and a second end 622. The second end 622 of the stud portion 62 connects the bump portion 60, and the first end 621 of the stud portion 62 contacts the first circuitry 4. As shown in FIG. 1, the first end 621 of the stud portion 62 of the first stud bump 6 protrudes from the first surface 31 of the encapsulant 3. That is, the first end 621 of the stud portion 62 extends past the first surface 31 of the encapsulant 3, and extends into and is embedded in the first circuitry 4. The first end 621 of the stud portion 62 may be surrounded by the first circuitry 4. In a manufacturing process, the bump portion 60 may be formed on a metal sheet (which will become the base layer 52 later) by a bonding head of a wire bonding apparatus. The bonding head may further move upward to form the stud portion 62. The top portion of the stud portion 62 is cut off to form the first end 621. Thus, the process of forming conductive vias (which may include drilling the encapsulant to form a plurality of through holes extending through the encapsulant and then plating a metal material in the through holes) is replaced by a wire bonding process. As a result, the difficulty and cost of a manufacturing process is reduced.

The conductive interconnector (e.g., second stud bump 7) electrically connects the semiconductor element 2 and the first circuitry 4. As shown in FIG. 1, the conductive interconnector may be at least one second stud bump 7. At least a portion of the second stud bump 7 is disposed in the encapsulant 3. That is, at least a portion of the second stud bump 7 is covered or encapsulated by the encapsulant 3. The second stud bump 7 electrically connects the pads 23 of the semiconductor element 2 and the first circuitry 4. The material of the second stud bump 7 may be or include, e.g., gold, copper, platinum coated copper, silver, a combination of two or more thereof, or another metal or combination of metals. In one embodiment, the second stud bump 7 includes a stud portion 72 and a bump portion 70. A width of the stud portion 72 is smaller than a width of the bump portion 70. It is noted that the stud portion 72 may be substantially in a pillar shape, and the bump portion 70 may be substantially in a disk shape. The stud portion 72 and the bump portion 70 may be formed concurrently and integrally by, e.g., a wire bonding apparatus.

The stud portion 72 includes a first end 721 and a second end 722. The second end 722 of the stud portion 72 connects the bump portion 70, and the first end 721 of the stud portion 72 contacts the first circuitry 4. As shown in FIG. 1, the first end 721 of the stud portion 72 of the second stud bump 7 protrudes from the first surface 31 of the encapsulant 3. That is, the first end 721 of the stud portion 72 extends past the first surface 31 of the encapsulant 3, and extends into and is embedded in the first circuitry 4. The first end 721 of the stud portion 72 may be surrounded by the first circuitry 4.

In some embodiments, as shown in FIG. 1, the widths of the stud portion 72 and the bump portion 70 of the second stud bump 7 may be smaller than the widths of the stud portion 62 and the bump portion 60 of the first stud bump 6, respectively. However, in other embodiments, the widths of the stud portion 72 and the bump portion 70 of the second stud bump 7 may be substantially the same as or greater than the widths of the stud portion 62 and the bump portion 60 of the first stud bump 6, respectively.

In some embodiments, as shown in FIG. 1, the stud portion 72 of the second stud bump 7 may be substantially perpendicular to the active surface 21 of the semiconductor element 2. Similarly, the stud portion 62 of the first stud bump 6 may be substantially perpendicular to the second surface 32 of the encapsulant 3. However, in some other embodiments, the stud portion 72 of the second stud bump 7 may not be perpendicular to the active surface 21 of the semiconductor element 2, or the stud portion 62 of the first stud bump 6 may not be perpendicular to the second surface 32 of the encapsulant 3. It is noted that the semiconductor element 2, the encapsulant 3, the adhesive layer 12, the first circuitry 4, the second circuitry 5, the first stud bump 6, and the conductive interconnector (e.g., second stud bump 7) may be formed by, e.g., wafer level packaging techniques and the like.

The first protection layer 82, such as a solder mask or other photo-dielectric material, covers the first circuitry 4 and the first surface 31 of the encapsulant 3, and the first protection layer 82 defines one or more openings 821 that expose at least a portion of the first circuitry 4 for external connection. The external connector (e.g., solder bump 86) is disposed in the openings 821 on the first circuitry 4. The top surface of circuitry 4 in the openings 821 may be covered with, e.g., nickel-gold (NiAu) or OSP (organic solder preservative) to facilitate solder wetting and forming solder bumps 86. The second protection layer 84, such as a solder mask, covers the second circuitry 5, the second surface 32 of the encapsulant 3 and the adhesive layer 12. The second protection layer 84 defines a plurality of openings 841 that expose at least a portion of the second circuitry 5 for external connection. The copper in the openings 841 may be protected by, e.g., NiAu, palladium (Pd), nickel-palladium-gold (NiPdAu) or OSP to facilitate external connections. The metallic surface protection may be formed by, e.g., an electroplating process or an electroless plating process. The protective coatings on circuitries 4 and 5 are omitted in FIG. 1 for simplicity.

Figure 2:
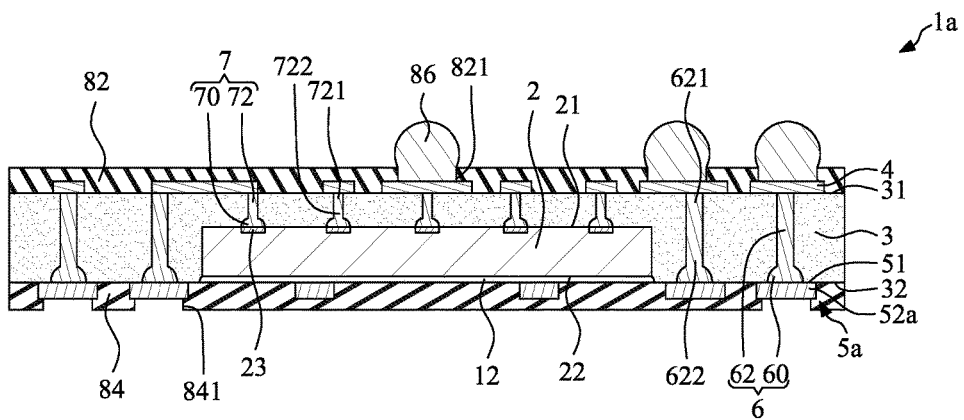
FIG. 2 depicts a cross-sectional view of an example of a semiconductor package according to some embodiments of the present disclosure.

FIG. 2 depicts a cross-sectional view of an example of a semiconductor package 1*a* according to some embodiments of the present disclosure. The semiconductor package 1*a* is similar to the semiconductor package 1 shown in FIG. 1, and similar features are numbered alike and not further described with respect to FIG. 2. In the semiconductor package 1*a* of FIG. 2, the first end 621 of the stud portion 62 of the first stud bump 6 and the first end 721 of the stud portion 72 of the second stud bump 7 do not protrude from the first surface 31 of the encapsulant 3. That is, the first end 621 of the stud portion 62 and the first end 721 of the stud portion 72 do not extend past the first surface 31 of the encapsulant 3. The top surface of the first end 621 of the stud portion 62 and the top surface of the first end 721 of the stud portion 72 are substantially coplanar with the first surface 31 of the encapsulant 3, and contact the bottom surface of the first circuitry 4.

In addition, in some embodiments, the surface layer 54 of the second circuitry 5 of FIG. 1 may be omitted. Thus, the second circuitry 5a of FIG. 2 may include the base layer 52a patterned from a metal sheet directly without a thinning stage. That is, the second circuitry 5a of FIG. 2 may be a single layer with a monolithic structure. A thickness of the base layer 52a of FIG. 2 may be greater than a thickness of the base layer 52 of FIG. 1.

Figure 3:
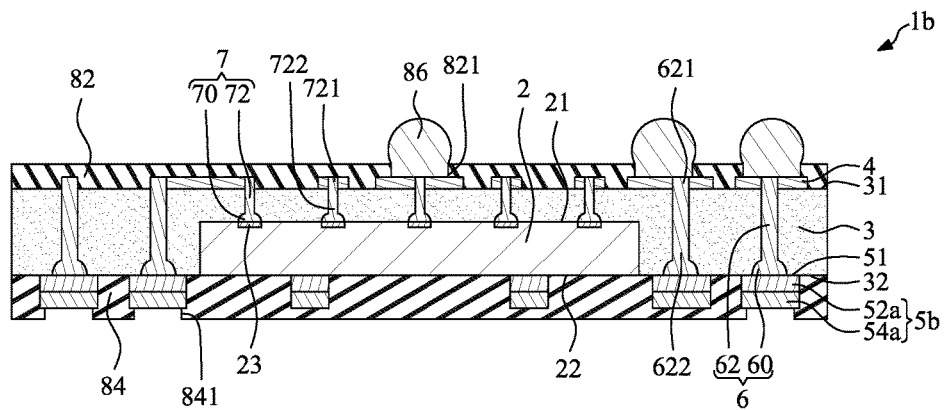
FIG. 3 depicts a cross-sectional view of an example of a semiconductor package according to some embodiments of the present disclosure.

FIG. 3 depicts a cross-sectional view of an example of a semiconductor package 1b according to some embodiments of the present disclosure. The semiconductor package 1b is similar to the semiconductor package 1 shown in FIG. 1, and similar features are numbered alike and not further described with respect to FIG. 3. In the semiconductor package 1b of FIG. 3, the adhesive layer 12 of FIG. 1 may be omitted. Thus, the backside surface 22 of the semiconductor element 2 may be substantially coplanar with the second surface 32 of the encapsulant 3, and the second protection layer 84 covers the backside surface 22 of the semiconductor element 2.

In addition, a thickness of the base layer 52a of the second circuitry 5b of FIG. 3 may be greater than a thickness of the base layer 52 of the second circuitry 5 of FIG. 1. The base layer 52a may be formed from a metal sheet without a thinning stage. Further, a thickness of the surface layer 54a of the second circuitry 5b of FIG. 3 may be greater than a thickness of the surface layer 54 of the second circuitry 5 of FIG. 1.

Figure 4:
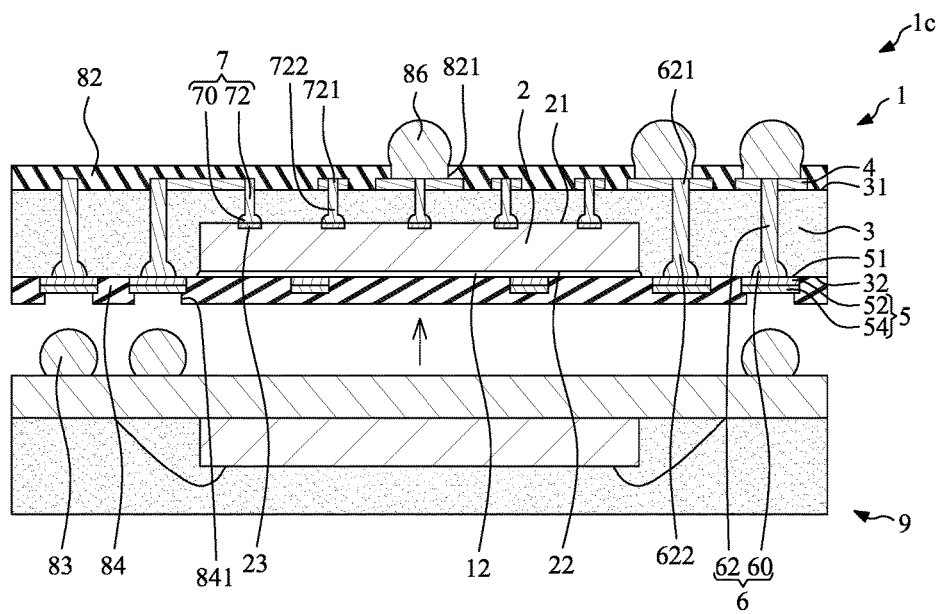
FIG. 4 depicts a cross-sectional view of an example of a semiconductor package according to some embodiments of the present disclosure.

FIG. 4 depicts a cross-sectional view of an example of a semiconductor package 1c according to some embodiments of the present disclosure. The semiconductor package 1c is similar to the semiconductor package 1 shown in FIG. 1, and similar features are numbered alike and not further described with respect to FIG. 4. In the semiconductor package 1c of FIG. 4, a bottom package 9 may be further attached to the semiconductor package 1 of FIG. 1. That is, the bottom package 9 is attached to the semiconductor package 1, and the semiconductor package 1c of FIG. 4 is a package-on-package (POP) structure. In one embodiment, the bottom package 9 is electrically connected to the portion of the second circuitry 5 exposed in the openings 841 of the second protection layer 84 through the connecting element 83.

Figure 5:
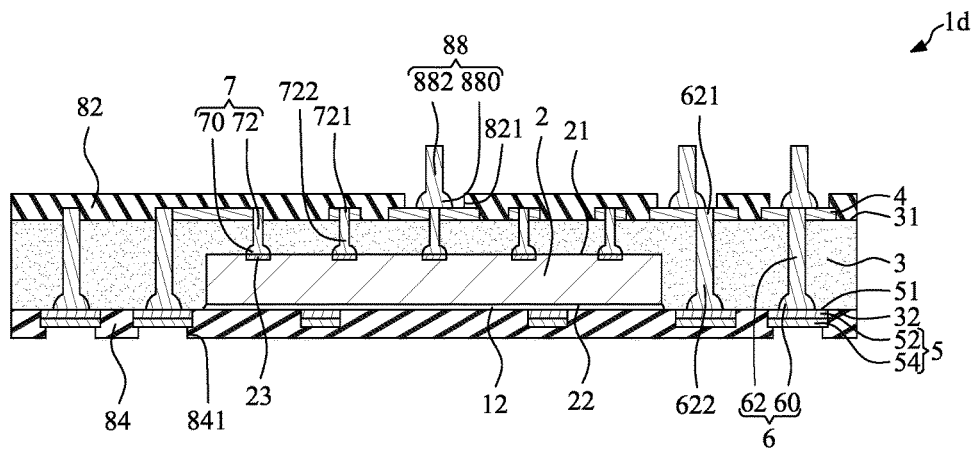
FIG. 5 depicts a cross-sectional view of an example of a semiconductor package according to some embodiments of the present disclosure.

FIG. 5 depicts a cross-sectional view of an example of a semiconductor package 1d according to some embodiments of the present disclosure. The semiconductor package 1d is similar to the semiconductor package 1 shown in FIG. 1, and similar features are numbered alike and not further described with respect to FIG. 5. In the semiconductor package 1d of FIG. 5, the external connector may be, e.g., a third stud bump 88. In one embodiment, the third stud bump 88 includes a stud portion 882 and a bump portion 880, wherein a width of the stud portion 882 is smaller than a width of the bump portion 880. It is noted that the stud portion 882 may be substantially in a pillar shape, and the bump portion 880 may be substantially in a disk shape. The stud portion 882 and the bump portion 880 may be formed concurrently and integrally by, e.g., a wire bonding apparatus. The bump portion 880 of the third stud bump 88 contacts the first circuitry 4 exposed in the opening 821 of the first protection layer 82.

Figure 6:
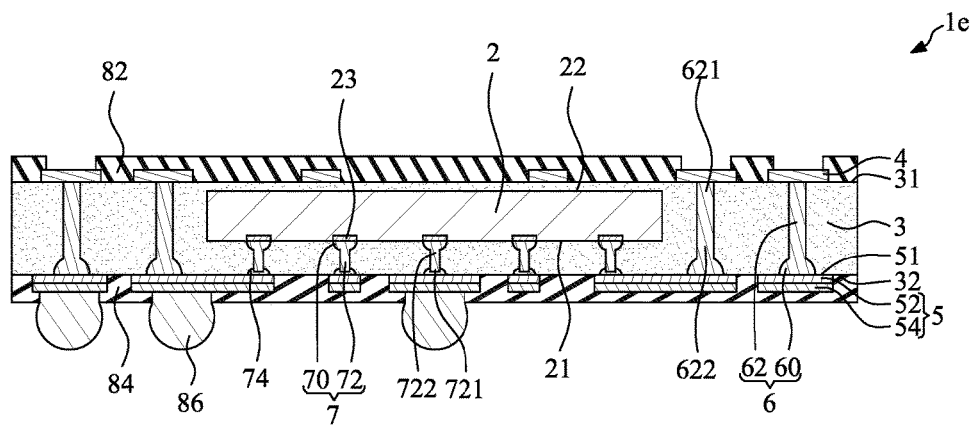
FIG. 6 depicts a cross-sectional view of an example of a semiconductor package according to some embodiments of the present disclosure.

FIG. 6 depicts a cross-sectional view of an example of a semiconductor package 1e according to some embodiments of the present disclosure. The semiconductor package 1e is similar to the semiconductor package 1 shown in FIG. 1, and similar features are numbered alike and not further described with respect to FIG. 6. In the semiconductor package 1e of FIG. 6, the active surface 21 of the semiconductor element 2 faces downward with reference to the orientation shown in FIG. 6. Further, the backside surface 22 of the semiconductor element 2 may be covered by the encapsulant 3, and may face upward with reference to the orientation shown in FIG. 6. In one embodiment, the backside surface 22 of the semiconductor element 2 is disposed adjacent to the first surface 31 of the encapsulant 3, and the active surface 21 of the semiconductor element 2 faces the second surface 32 of the encapsulant 3.

As shown in FIG. 6, the first end 621 of the stud portion 62 of the first stud bump 6 does not protrude from the first surface 31 of the encapsulant 3. That is, the first end 621 of the stud portion 62 does not extend past the first surface 31 of the encapsulant 3. The top surface of the first end 621 of the stud portion 62 is substantially coplanar with the first surface 31 of the encapsulant 3, and contacts the bottom surface of the first circuitry 4. In addition, the second stud bump 7 electrically connects the pads 23 of the semiconductor element 2 and the second circuitry 5. In one embodiment, the first end 721 of the stud portion 72 of the second stud bump 7 is electrically connected to the base layer 52 of the second circuitry 5 through a solder 74.

Figure 7:
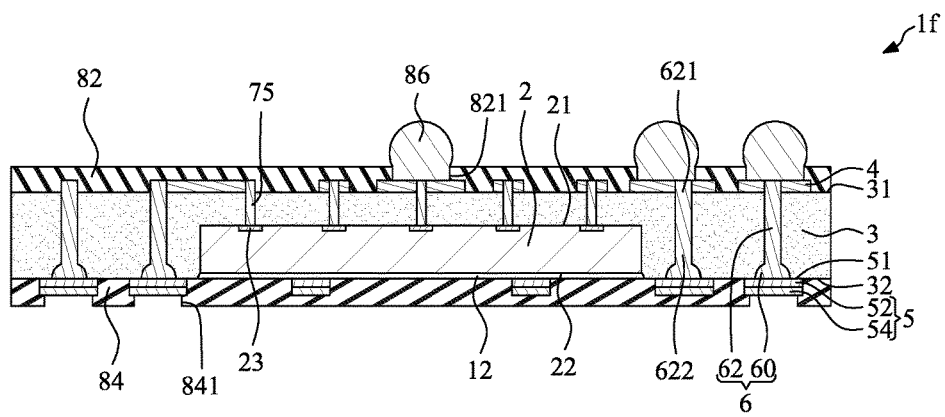
FIG. 7 depicts a cross-sectional view of an example of a semiconductor package according to some embodiments of the present disclosure.

FIG. 7 depicts a cross-sectional view of an example of a semiconductor package if according to some embodiments of the present disclosure. The semiconductor package if is similar to the semiconductor package 1 shown in FIG. 1, and similar features are numbered alike and not further described with respect to FIG. 7. In the semiconductor package if of FIG. 7, the conductive interconnector may be, e.g., a conductive pillar 75 instead of a second stud bump 7 (as shown in FIG. 1). The conductive pillars 75 may be formed by, e.g., plating or other means. The conductive pillar 75 electrically connects and physically contacts the pads 23 of the semiconductor element 2 and the first circuitry 4.

Figure 8:
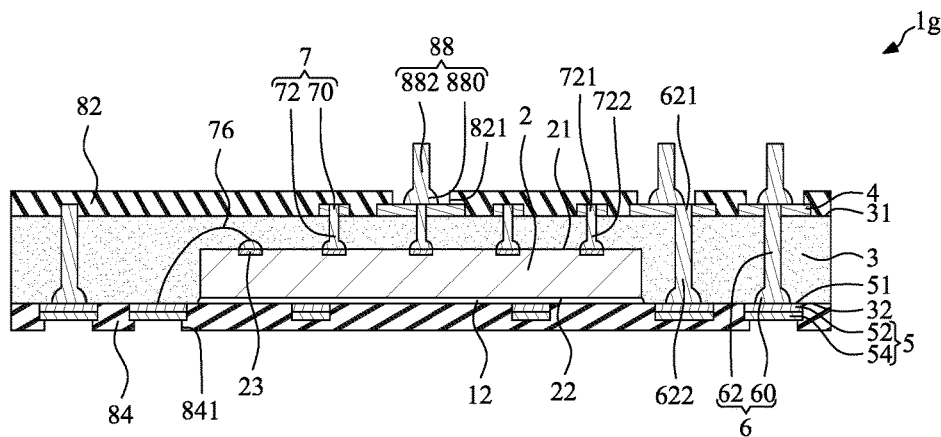
FIG. 8 depicts a cross-sectional view of an example of a semiconductor package according to some embodiments of the present disclosure.

FIG. 8 depicts a cross-sectional view of an example of a semiconductor package 1g according to some embodiments of the present disclosure. The semiconductor package 1g is similar to the semiconductor package 1d shown in FIG. 5, and similar features are numbered alike and not further described with respect to FIG. 8. The semiconductor package 1g of FIG. 8 includes at least one bonding wire 76 that electrically connects the pads 23 of the active surface 21 of the semiconductor element 2 and the base layer 52 of the second circuitry 5. The bonding wire 76 may be formed using, e.g., a wire bonding tool, and may start on the pad 23 and terminate on the pad 32 or vice-a-versa.

Figure 9:
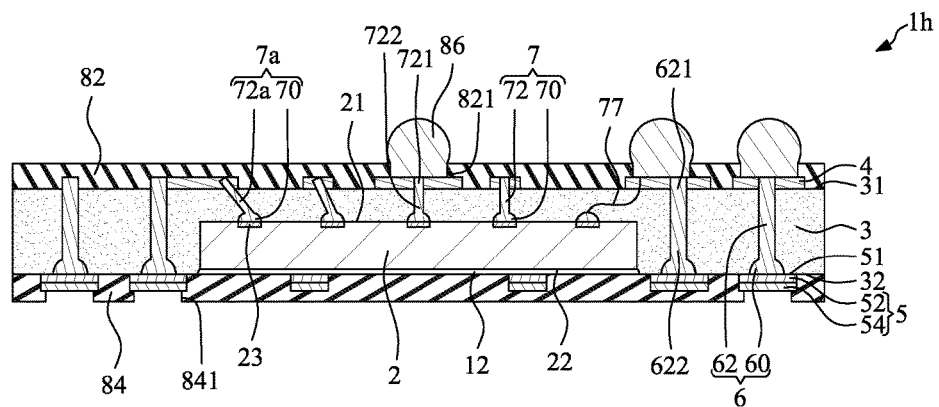
FIG. 9 depicts a cross-sectional view of an example of a semiconductor package according to some embodiments of the present disclosure.

FIG. 9 depicts a cross-sectional view of an example of a semiconductor package 1h according to some embodiments of the present disclosure. The semiconductor package 1h is similar to the semiconductor package 1 shown in FIG. 1, and similar features are numbered alike and not further described with respect to FIG. 9. In the semiconductor package 1h of FIG. 9, the stud portion 72 of at least one of the second stud bump 7 (e.g., the conductive interconnector) may be not perpendicular to the active surface 21 of the semiconductor element 2. That is, there is an acute angle formed between the stud portion 72 of the second stud bump 7 (e.g., the conductive interconnector) and the active surface 21 of the semiconductor element 2. In addition, at least one of the conductive interconnector may be a bonding wire 77.

Figure 10:
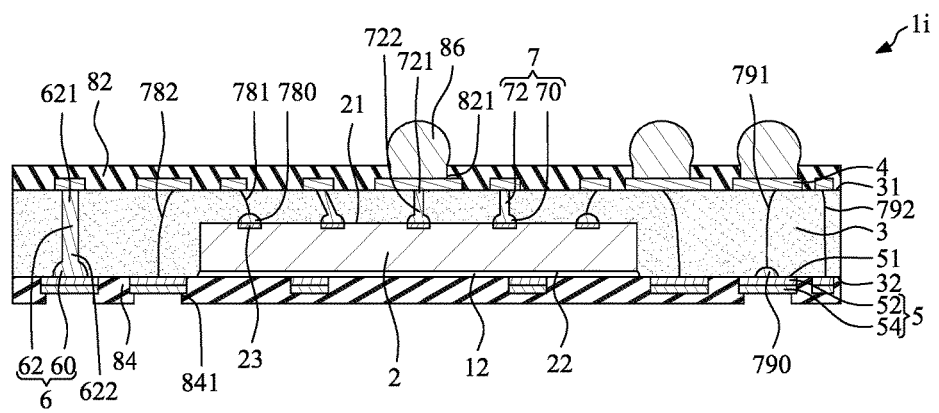
FIG. 10 depicts a cross-sectional view of an example of a semiconductor package according to some embodiments of the present disclosure.

FIG. 10 depicts a cross-sectional view of an example of a semiconductor package 1i according to some embodiments of the present disclosure. The semiconductor package 1i is similar to the semiconductor package 1h shown in FIG. 9, and similar features are numbered alike and not further described with respect to FIG. 10. In the semiconductor package 1*i* of FIG. 10, the first end 621 of the stud portion 62 of the first stud bump 6 and the first end 721 of the stud portion 72 of the second stud bump 7 do not protrude from the first surface 31 of the encapsulant 3. That is, the first end 621 of the stud portion 62 and the first end 721 of the stud portion 72 do not extend past the first surface 31 of the encapsulant 3. The top surface of the first end 621 of the stud portion 62 and the top surface of the first end 721 of the stud portion 72 are substantially coplanar with the first surface 31 of the encapsulant 3, and contact the bottom surface of the first circuitry 4.

In addition, the semiconductor package 1*i* of FIG. 10 further includes a first wire segment 781, a second wire segment 782, a third wire segment 791 and a fourth wire segment 792 in the encapsulant 3. The first wire segment 781 electrically connects the first circuitry 4 and the semiconductor element 2. For example, one end of the first wire segment 781 connects the pad 23 of the semiconductor element 2 through a bump portion 780, and the other end of the first wire segment 781 connects the bottom surface of the first circuitry 4. One end of the second wire segment 782 connects the bottom surface of the first circuitry 4, and the other end of the second wire segment 782 connects the first surface 51 of the second circuitry 5. It is noted that the first wire segment 781 and the second wire segment 782 are individual segments that are separate from each other, and they are formed from a single bonding wire.

The third wire segment 791 and the fourth wire segment 792 both electrically connect the first circuitry 4 and the second circuitry 5. One end of the third wire segment 791 connects the bottom surface of the first circuitry 4, and the other end of the third wire segment 791 connects the first surface 51 of the second circuitry 5 through the bump portion 790. Similarly, one end of the fourth wire segment 792 connects the bottom surface of the first circuitry 4, and the other end of the fourth wire segment 792 connects the first surface 51 of the second circuitry 5. It is noted that the third wire segment 791 and the fourth wire segment 792 may be individual segments that are separate from each other, and they may be formed from a single bonding wire.

Figure 11:
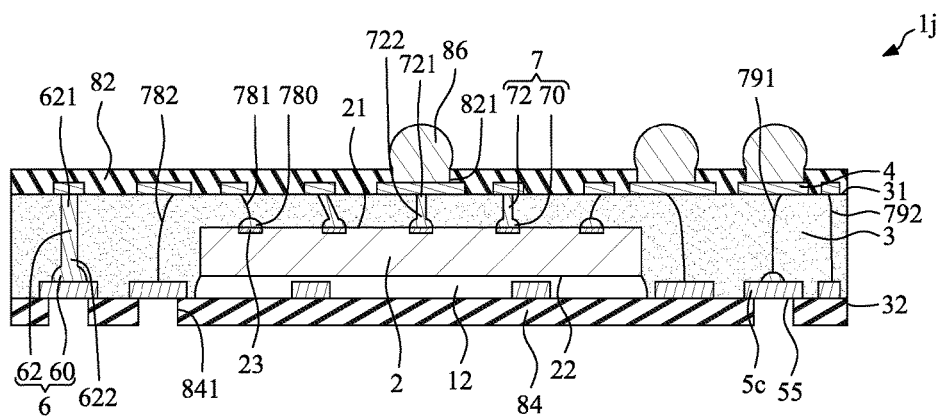
FIG. 11 depicts a cross-sectional view of an example of a semiconductor package according to some embodiments of the present disclosure.

FIG. 11 depicts a cross-sectional view of an example of a semiconductor package 1*j* according to some embodiments of the present disclosure. The semiconductor package 1*j* is similar to the semiconductor package 1*i* shown in FIG. 10, and similar features are numbered alike and not further described with respect to FIG. 11. In the semiconductor package 1*j* of FIG. 11, the second circuitry 5*c* is embedded in the encapsulant 3, and the bottom surface 55 of the second circuitry 5*c* is substantially coplanar with the second surface 32 of the encapsulant 3. That is, the bottom surface 55 of the second circuitry 5*c* is exposed from the second surface 32 of the encapsulant 3. It is noted that the thickness of the adhesive layer 12 may be greater than the thickness of the second circuitry 5*c* so as to prevent the semiconductor element 2 from contacting a portion of the second circuitry 5*c* that is disposed under the semiconductor element 2.

Figure 12:
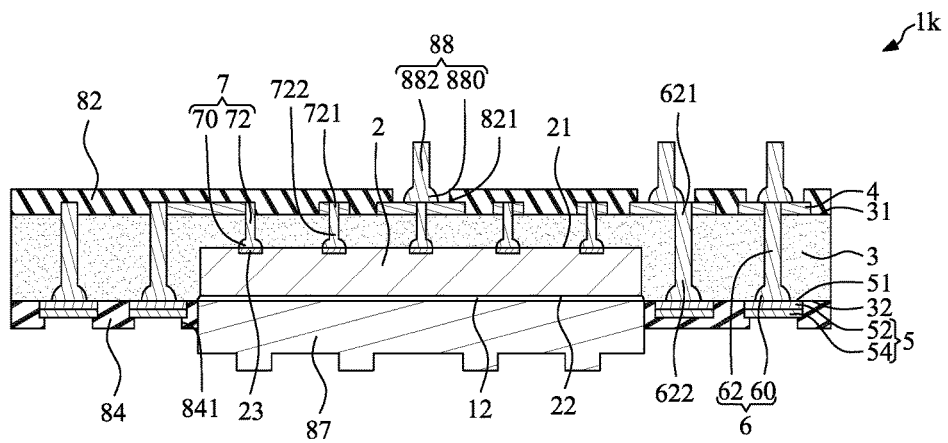
FIG. 12 depicts a cross-sectional view of an example of a semiconductor package according to some embodiments of the present disclosure.

FIG. 12 depicts a cross-sectional view of an example of a semiconductor package 1*k* according to some embodiments of the present disclosure. The semiconductor package 1*k* is similar to the semiconductor package 1*d* shown in FIG. 5, and similar features are numbered alike and not further described with respect to FIG. 12. The semiconductor package 1*k* of FIG. 12 includes a heat sink 87 attached to a position corresponding to (e.g., below or on top of) the semiconductor element 2 so as to dissipate the heat generated by the semiconductor element 2. As shown in FIG. 12, the heat sink 87 is attached to a position adjacent to the backside surface 22 of the semiconductor element 2. The heat sink 87 may be attached to the adhesive layer 12 on the backside surface 22 of the semiconductor element 2, or the heat sink 87 may be attached to the backside surface 22 of the semiconductor element 2 directly. The adhesive layer 12 may be, e.g., a thermally enhanced adhesive, a metallic paste, a solder, or a combination of two or more thereof. The heat sink 87 may be a fin-type heat sink (including fins) so as to increase the heat dissipating area. It is noted that the semiconductor package 1*k* may be, e.g., a power package including a metal-oxide-semiconductor field-effect transistor (MOSFET).

Figure 13:
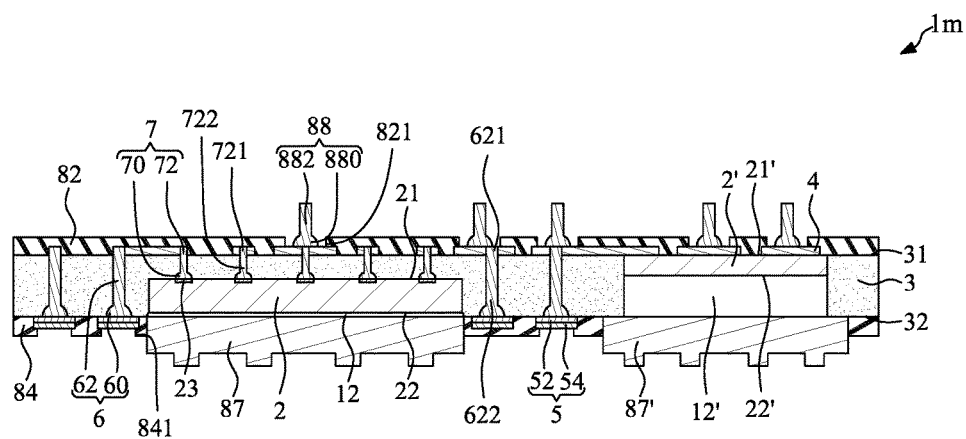
FIG. 13 depicts a cross-sectional view of an example of a semiconductor package according to some embodiments of the present disclosure.

FIG. 13 depicts a cross-sectional view of an example of a semiconductor package 1*m* according to some embodiments of the present disclosure. The semiconductor package 1*m* is similar to the semiconductor package 1*k* shown in FIG. 12, and similar features are numbered alike and not further described with respect to FIG. 13. The semiconductor package 1*m* of FIG. 13 includes a left part and a right part. The left part of the semiconductor package 1*m* of FIG. 13 is the same as the semiconductor package 1*k* shown in FIG. 12. The right part of the semiconductor package 1*m* of FIG. 13 includes a semiconductor element 2', an adhesive layer 12' and a heat sink 87'.

The semiconductor element 2' has an active surface 21' and a backside surface 22' opposite to the active surface 21'. The first circuitry 4 is electrically connected to the active surface 21' of the semiconductor element 2'. The adhesive layer 12' is disposed on the backside surface 22' of the semiconductor element 2'. The heat sink 87' is attached to a position adjacent to the backside surface 22' of the semiconductor element 2'. The heat sink 87' may be attached to the adhesive layer 12' disposed on the backside surface 22' of the semiconductor element 2'. Alternatively, the heat sink 87' may be attached to the backside surface 22' of the semiconductor element 2' directly. The heat sink 87' may be a fin-type heat sink (including fins) so as to increase the heat dissipating area. It is noted that the semiconductor package 1*m* may include, e.g., a metal-oxide-semiconductor field-effect transistor (MOSFET), wherein the semiconductor element 2 may be a power die, and the semiconductor element 2' may be a controller die.

Figure 14:
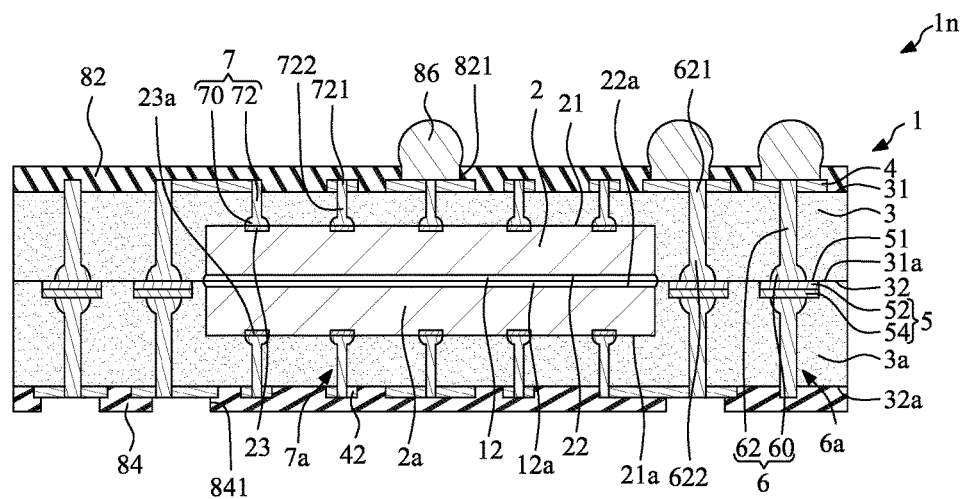
FIG. 14 depicts a cross-sectional view of an example of a semiconductor package according to some embodiments of the present disclosure.

FIG. 14 depicts a cross-sectional view of an example of a semiconductor package 1*n* according to some embodiments of the present disclosure. The semiconductor package 1*n* is similar to the semiconductor package 1 shown in FIG. 1, and similar features are numbered alike and not further described with respect to FIG. 14. The semiconductor package 1*n* of FIG. 14 includes a top part and a bottom part. The top part of the semiconductor package 1*n* of FIG. 14 is the same as the semiconductor package 1 shown in FIG. 1. The bottom part of the semiconductor package 1*n* of FIG. 14 includes at least one bottom semiconductor element 2*a*, a bottom encapsulant 3*a*, a bottom adhesive layer 12*a*, a third circuitry 42, at least one third stud bump 6*a* and at least one conductive interconnector (e.g., fourth stud bump 7*a*).

The bottom semiconductor element 2*a* may be a semiconductor die or an electronic component (e.g., passive component), and is disposed under the semiconductor element 2. The bottom semiconductor element 2*a* has an active surface 21*a*, a backside surface 22*a* opposite to the active surface 21*a* and a plurality of pads 23*a*. The active surface 21*a* of the bottom semiconductor element 2*a* faces downward with reference to the orientation shown in FIG. 14. The backside surface 22*a* of the bottom semiconductor element 2a may be covered by the bottom adhesive layer 12a, and faces upward with reference to the orientation shown in FIG. 14. The backside surface 22a of the bottom semiconductor element 2a faces toward the backside surface 22 of the semiconductor element 2. The pads 23a of the bottom semiconductor element 2a are disposed adjacent to the active surface 21a of the bottom semiconductor element 2a.

The bottom encapsulant 3a covers or encapsulates at least a portion of the bottom semiconductor element 2a. A material of the bottom encapsulant 3a may include a molding compound (such as epoxy resin with fillers), a photo-imageable dielectric (such as solder mask or other suitable dielectric materials), or a combination thereof. The material of the bottom encapsulant 3a may be the same as or different from the material of the encapsulant 3. The bottom encapsulant 3a has a first surface 31a and a second surface 32a opposite to the first surface 31a. As shown in FIG. 14, the bottom encapsulant 3a covers a portion of the active surface 21a of the bottom semiconductor element 2a, the lateral surface of the bottom semiconductor element 2a, the third stud bump 6a, and the conductive interconnector (e.g., fourth stud bump 7a). Thus, the bottom semiconductor element 2a is embedded at least in part in the bottom encapsulant 3a. In one embodiment, the active surface 21a of the bottom semiconductor element 2a faces toward the second surface 32a of the bottom encapsulant 3a, and the backside surface 22a of the bottom semiconductor element 2a is disposed adjacent to the first surface 31a of the bottom encapsulant 3a. It is noted that the bottom encapsulant 3a is disposed on the encapsulant 3. That is, the first surface 31a of the bottom encapsulant 3a contacts the second surface 32 of the encapsulant 3, and the second circuitry 5 is embedded in the bottom encapsulant 3a.

The third circuitry 42 (e.g., a redistribution layer (RDL)) is disposed adjacent to the second surface 32a of the bottom encapsulant 3a. As shown in FIG. 14, the third circuitry 42 is disposed on and contacts the second surface 32a of the bottom encapsulant 3a. The third circuitry 42 is disposed under the active surface 21a of the bottom semiconductor element 2a. Thus, the active surface 21a of the bottom semiconductor element 2a faces the third circuitry 4. It is noted that the third circuitry 42 may include a plurality of fan-out traces and/or a plurality of bump pads that are formed by, for example, plating or ink jet printing.

The third stud bump 6a is disposed in the bottom encapsulant 3a. That is, the third stud bump 6a is covered or encapsulated by the bottom encapsulant 3a. The third stud bump 6a electrically connects the third circuitry 42 and the second circuitry 5. The material of the third stud bump 6a may be or include, e.g., gold, copper, silver, or a combination of two or more thereof. As shown in FIG. 14, the third stud bump 6a contacts the second circuitry 5 directly. As shown in FIG. 14, one end of the third stud bump 6a protrudes from the second surface 32a of the bottom encapsulant 3a. That is, the end of the third stud bump 6a extends past the second surface 32a of the bottom encapsulant 3a, and extends into and is embedded in the third circuitry 42.

The conductive interconnector (e.g., fourth stud bump 7a) electrically connects the bottom semiconductor element 2a and the third circuitry 42. As shown in FIG. 14, the conductive interconnector may be or include, e.g., at least one fourth stud bump 7a. The fourth stud bump 7a is disposed in the bottom encapsulant 3a. The fourth stud bump 7a electrically connects the pads 23a of the bottom semiconductor element 2a and the third circuitry 42. The material of the fourth stud bump 7a may be or include, e.g., gold, copper, silver, or a combination of two or more thereof. As shown in FIG. 14, one end of the fourth stud bump 7a protrudes from the second surface 32a of the bottom encapsulant 3a. That is, the end of the fourth stud bump 7a extends past the second surface 32a of the bottom encapsulant 3a, and extends into and is embedded in the third circuitry 42.

The second protection layer 84, such as a solder mask, covers the second surface 32a of the bottom encapsulant 3a and the third circuitry 42. The second protection layer 84 defines a plurality of openings 841 that expose at least a portion of the third circuitry 42 for external connection.

Figure 15:
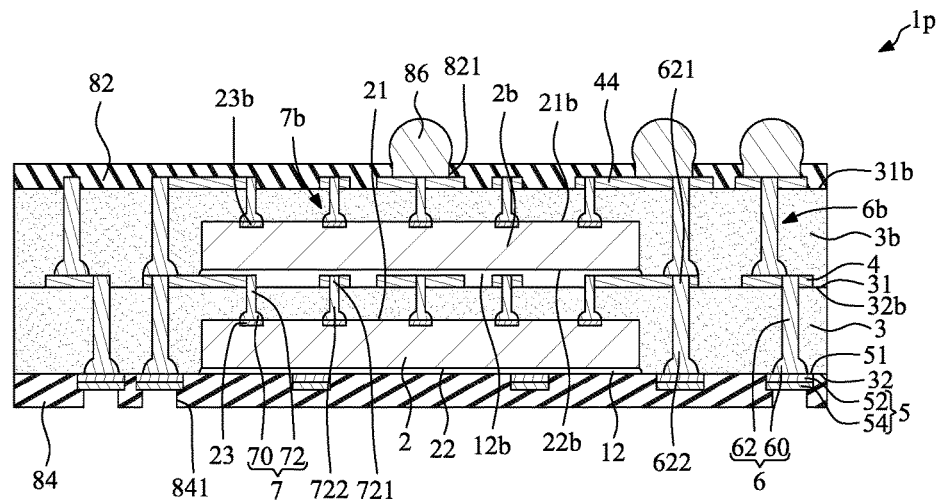
FIG. 15 depicts a cross-sectional view of an example of a semiconductor package according to some embodiments of the present disclosure.

FIG. 15 depicts a cross-sectional view of an example of a semiconductor package 1p according to some embodiments of the present disclosure. The semiconductor package 1p is similar to the semiconductor package 1 shown in FIG. 1, and similar features are numbered alike and not further described with respect to FIG. 15. The semiconductor package 1p of FIG. 15 includes a top part and a bottom part. The bottom part of the semiconductor package 1p of FIG. 15 is the same as the semiconductor package 1 shown in FIG. 1. The top part of the semiconductor package 1p of FIG. 15 includes at least one top semiconductor element 2b, a top encapsulant 3b, a top adhesive layer 12b, a fourth circuitry 44, at least one fifth stud bump 6b, and at least one conductive interconnector (e.g., sixth stud bump 7b).

The top semiconductor element 2b may be a semiconductor die or an electronic component (e.g., passive component), and may be disposed above the semiconductor element 2. The top semiconductor element 2b has an active surface 21b, a backside surface 22b opposite to the active surface 21b and a plurality of pads 23b. The active surface 21b of the top semiconductor element 2b faces upward with reference to the orientation shown in FIG. 15. The backside surface 22b of the top semiconductor element 2b may be covered by the top adhesive layer 12b, and faces downward with reference to the orientation shown in FIG. 15. The backside surface 22b of the top semiconductor element 2b faces toward the active surface 21 of the semiconductor element 2. The pads 23b of the top semiconductor element 2b are disposed adjacent to the active surface 21b of the top semiconductor element 2b.

The top encapsulant 3b covers or encapsulates at least a portion of the top semiconductor element 2b. A material of the top encapsulant 3b may include a molding compound (such as epoxy resin with fillers), a photo-imageable dielectric (such as solder mask or other suitable dielectric materials), or a combination thereof. The material of the top encapsulant 3b may be the same as or different from the material of the encapsulant 3. The top encapsulant 3b has a first surface 31b and a second surface 32b opposite to the first surface 31b. As shown in FIG. 15, the top encapsulant 3b covers a portion of the active surface 21b of the top semiconductor element 2b, the lateral surface of the top semiconductor element 2b, the fifth stud bump 6b, and the conductive interconnector (e.g., sixth stud bump 7b). Thus, the top semiconductor element 2b is embedded at least in part in the top encapsulant 3b. In one embodiment, the active surface 21b of the top semiconductor element 2b faces toward the first surface 31b of the top encapsulant 3b, and the backside surface 22b of the top semiconductor element 2b is disposed adjacent to the second surface 32b of the top encapsulant 3b. It is noted that the top encapsulant 3b is disposed on the encapsulant 3. That is, the second surface 32b of the top encapsulant 3b contacts the first surface 31 of the encapsulant 3, the top adhesive layer 12b covers a portion of the first circuitry 4, and another portion of the first circuitry 4 is embedded in the top encapsulant 3b.

The fourth circuitry 44 (e.g., a redistribution layer (RDL)) is disposed adjacent to the first surface 31b of the top encapsulant 3b. As shown in FIG. 15, the fourth circuitry 44 is disposed on and contacts the first surface 31b of the top encapsulant 3b. The fourth circuitry 44 is disposed above the active surface 21b of the top semiconductor element 2b, thus, the active surface 21b of the top semiconductor element 2b faces the fourth circuitry 44. It is noted that the fourth circuitry 44 may include a plurality of fan-out traces and/or a plurality of bump pads that are formed by, for example, plating or ink jet printing.

The fifth stud bump 6b is disposed in the top encapsulant 3b. That is, the fifth stud bump 6b is covered or encapsulated by the top encapsulant 3b. The fifth stud bump 6b electrically connects the fourth circuitry 44 and the first circuitry 4. The material of the fifth stud bump 6b may be or include, e.g., gold, copper, silver, or a combination of two or more thereof. As shown in FIG. 15, the fifth stud bump 6b contacts the first circuitry 4 directly. As shown in FIG. 15, one end of the fifth stud bump 6b protrudes from the first surface 31b of the top encapsulant 3b. That is, the end of the fifth stud bump 6b extends past the first surface 31b of the top encapsulant 3b, and extends into and is embedded in the fourth circuitry 44.

The conductive interconnector (e.g., sixth stud bump 7b) electrically connects the top semiconductor element 2b and the fourth circuitry 44. As shown in FIG. 15, the conductive interconnector may be at least one sixth stud bump 7b. The sixth stud bump 7b is disposed in the top encapsulant 3b. The sixth stud bump 7b electrically connects the pads 23b of the top semiconductor element 2b and the fourth circuitry 44. The material of the sixth stud bump 7b may be or include, e.g., gold, copper, silver, or a combination of two or more thereof. As shown in FIG. 15, one end of the sixth stud bump 7b protrudes from the first surface 31b of the top encapsulant 3b. That is, the end of the sixth stud bump 7b extends past the first surface 31b of the top encapsulant 3b, and extends into and is embedded in the fourth circuitry 44.

The first protection layer 82, such as a solder mask, covers the first surface 31b of the top encapsulant 3b and the fourth circuitry 44. The first protection layer 82 defines a plurality of openings 821 that expose a portion of the fourth circuitry 44 for external connection.

Figure 16:
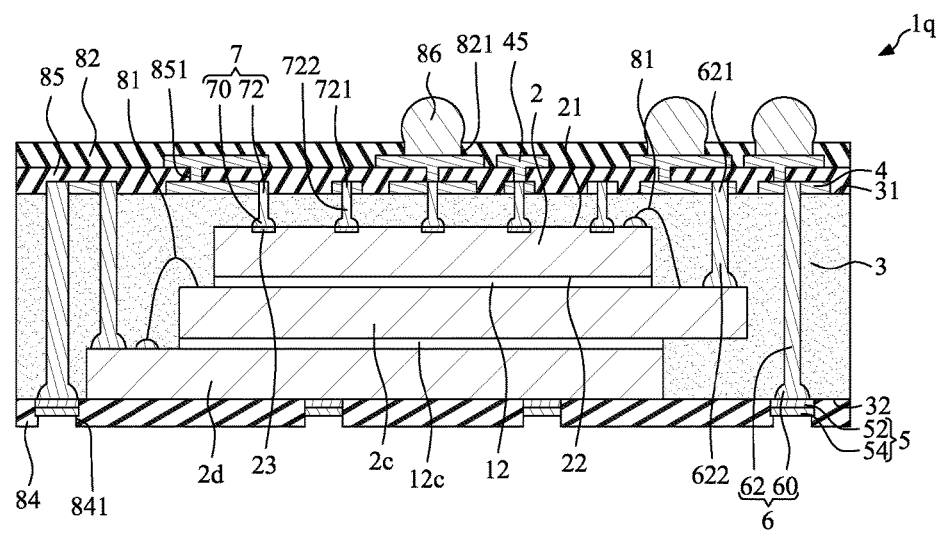
FIG. 16 depicts a cross-sectional view of an example of a semiconductor package according to some embodiments of the present disclosure.

FIG. 16 depicts a cross-sectional view of an example of a semiconductor package 1q according to some embodiments of the present disclosure. The semiconductor package 1q is similar to the semiconductor package 1 shown in FIG. 1, and similar features are numbered alike and not further described with respect to FIG. 16. The semiconductor package 1q of FIG. 16 includes three stacked semiconductor elements (e.g., the semiconductor element 2, an intermediate semiconductor element 2c and a lower semiconductor element 2d). In addition, the semiconductor package 1q of FIG. 16 further includes a plurality of internal wires 81, a third protection layer 85 and a fifth circuitry 45. The semiconductor element 2 is attached to the intermediate semiconductor element 2c through the adhesive layer 12. The intermediate semiconductor element 2c is attached to the lower semiconductor element 2d through an adhesive layer 12c. The sizes of the three stacked semiconductor elements (e.g., the semiconductor element 2, the intermediate semiconductor element 2c and the lower semiconductor element 2d) may be different. The locations and/or the sizes of the stacked semiconductor elements may be shifted with respect to each other.

Some of the internal wires 81 connect the semiconductor element 2 and the intermediate semiconductor element 2c, and some of the internal wires 81 connect the intermediate semiconductor element 2c and the lower semiconductor element 2d. In addition, some of the first stud bumps 6 connect the intermediate semiconductor element 2c and the first circuitry 4, and some of the first stud bumps 6 connect the lower semiconductor element 2d and the first circuitry 4. The third protection layer 85, such as a solder mask, covers the first circuitry 4 and the first surface 31 of the encapsulant 3. The third protection layer 85 defines a plurality of openings 851 that expose a portion of the first circuitry 4. The fifth circuitry 45 is disposed on the third protection layer 85 and in the openings 851 to electrically connect the first circuitry 4. The first protection layer 82, such as a solder mask, covers the fifth circuitry 45 and the third protection layer 85. The first protection layer 82 defines a plurality of openings 821 that expose a portion of the fifth circuitry 45 for external connection. The external connector (e.g., solder bump 86) is disposed in the openings 821 on the fifth circuitry 45. The diameter of the first stud bumps 6 for each level may be different to ensure mechanical rigidity during manufacturing or to meet electrical design specifications.

Figure 17:
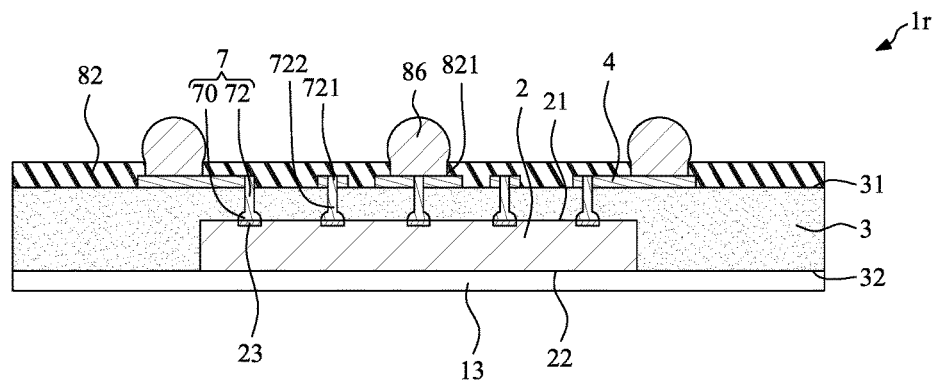
FIG. 17 depicts a cross-sectional view of an example of a semiconductor package according to some embodiments of the present disclosure.

FIG. 17 depicts a cross-sectional view of an example of a semiconductor package 1r according to some embodiments of the present disclosure. The semiconductor package 1r is similar to the semiconductor package 1 shown in FIG. 1, and similar features are numbered alike and not further described with respect to FIG. 17. In the semiconductor package 1r of FIG. 17, the adhesive layer 12, the second circuitry 5, the first stud bump 6 and the second protection layer 84 may be omitted, according to some embodiments. The backside surface 22 of the semiconductor element 2 is substantially coplanar with the second surface 32 of the encapsulant 3. A lower adhesion layer 13 (e.g., a tape) may be disposed on the backside surface 22 of the semiconductor element 2 and the second surface 32 of the encapsulant 3. In some other embodiments, the lower adhesion layer 13 may be omitted.

Figure 18:
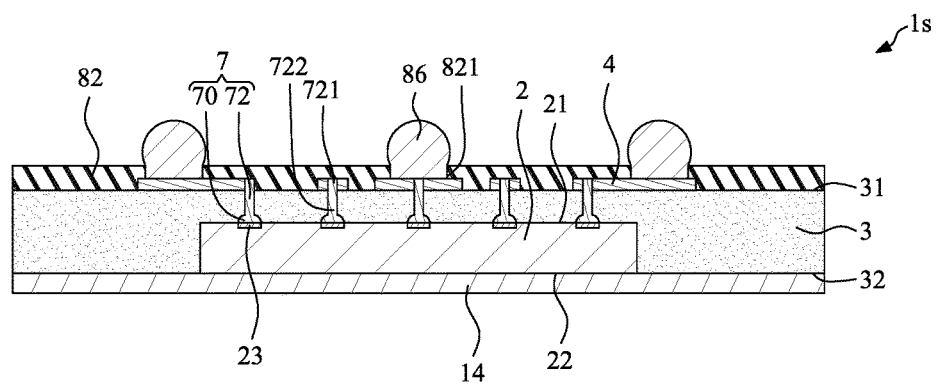
FIG. 18 depicts a cross-sectional view of an example of a semiconductor package according to some embodiments of the present disclosure.

FIG. 18 depicts a cross-sectional view of an example of a semiconductor package 1s according to some embodiments of the present disclosure. The semiconductor package 1s is similar to the semiconductor package 1r shown in FIG. 17, and similar features are numbered alike and not further described with respect to FIG. 18. In the semiconductor package is of FIG. 18, the lower adhesion layer 13 may be replaced by, e.g., a metal layer 14. The material of the metal layer 14 may be or include, e.g., copper. The metal layer 14 may be used as a heat sink which can dissipate the heat generated by the semiconductor element 2. In one embodiment, the lower adhesion layer 13 may remain and the metal layer 14 may be disposed on the lower adhesion layer 13.

Figure 19:
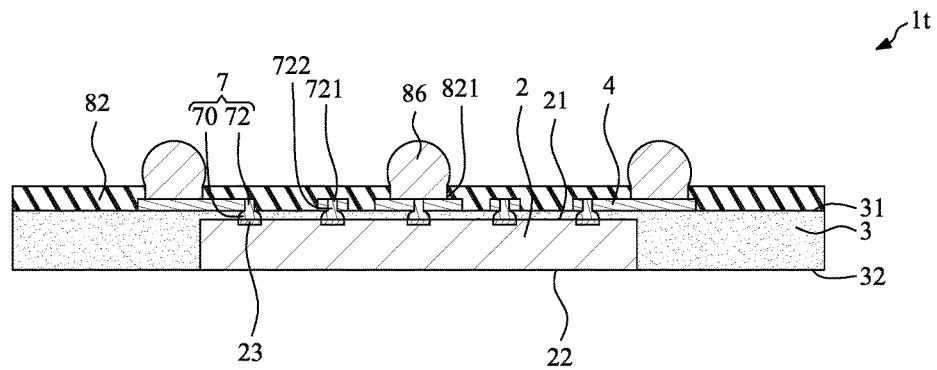
FIG. 19 depicts a cross-sectional view of an example of a semiconductor package according to some embodiments of the present disclosure.

FIG. 19 depicts a cross-sectional view of an example of a semiconductor package 1t according to some embodiments of the present disclosure. The semiconductor package 1t is similar to the semiconductor package 1r shown in FIG. 17, and similar features are numbered alike and not further described with respect to FIG. 19. In the semiconductor package 1t of FIG. 19, the length of the stud portion 72 of the second stud bump 7 may be shortened, and the first protection layer 82 may contact the bump portion 70. Thus, the overall thickness of the semiconductor package 1t of FIG. 19 is less than the overall thickness of the semiconductor package 1r shown in FIG. 17. This bump structure may avoid a plated pillar process which involves photo lithography, sputter seeding and plating, and concomitant masks and tools.

Figure 20:
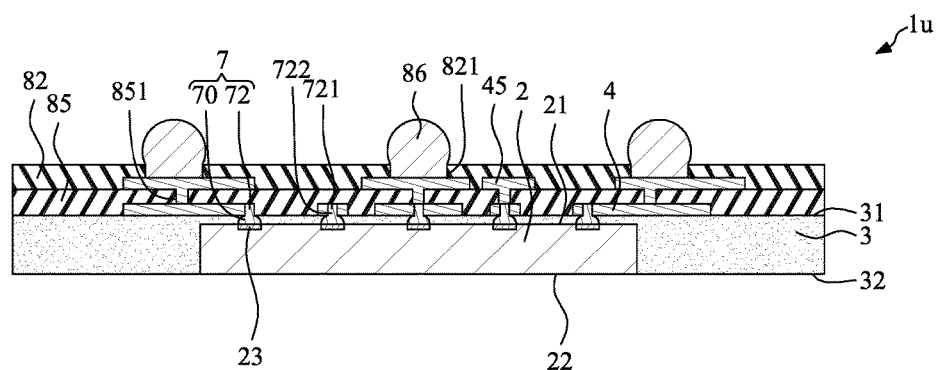
FIG. 20 depicts a cross-sectional view of an example of a semiconductor package according to some embodiments of the present disclosure.

FIG. 20 depicts a cross-sectional view of an example of a semiconductor package 1u according to some embodiments of the present disclosure. The semiconductor package 1*u* is similar to the semiconductor package 1*t* shown in FIG. 19, and similar features are numbered alike and not further described with respect to FIG. 20. The semiconductor package 1*u* of FIG. 20 includes a third protection layer 85 and a fifth circuitry 45.

The third protection layer 85, such as a solder mask, covers the first circuitry 4 and the first surface 31 of the encapsulant 3. The third protection layer 85 defines a plurality of openings 851 that expose a portion of the first circuitry 4. The fifth circuitry 45 is disposed on the third protection layer 85 and in the openings 851 to electrically connect the first circuitry 4. The first protection layer 82, such as a solder mask, covers the fifth circuitry 45 and the third protection layer 85. The first protection layer 82 defines a plurality of openings 821 that expose a portion of the fifth circuitry 45 for external connection. The external connector (e.g., solder bump 86) is disposed in the openings 821 on the fifth circuitry 45.

Figure 21:
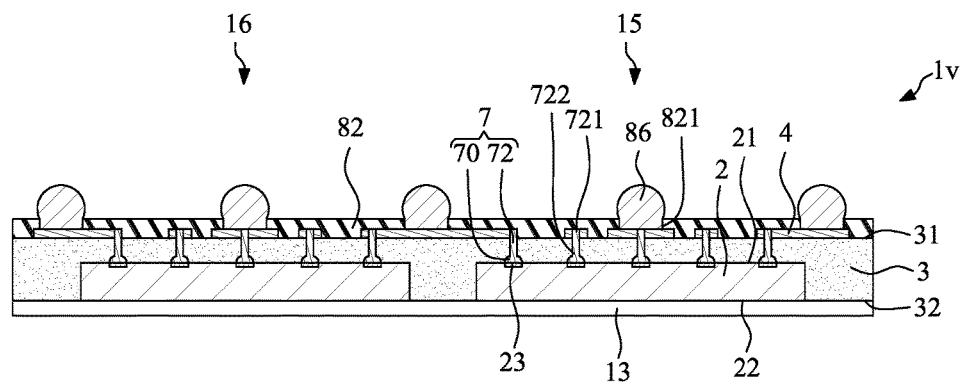
FIG. 21 depicts a cross-sectional view of an example of a semiconductor package according to some embodiments of the present disclosure.

FIG. 21 depicts a cross-sectional view of an example of a semiconductor package 1*v* according to some embodiments of the present disclosure. The semiconductor package 1*v* is similar to the semiconductor package 1*r* shown in FIG. 17, and similar features are numbered alike and not further described with respect to FIG. 21. The semiconductor package 1*v* of FIG. 21 includes a first portion 15 and a second portion 16. Each of the first portion 15 and the second portion 16 is substantially equal to the semiconductor package 1*r* of FIG. 17. That is, the semiconductor package 1*v* of FIG. 21 may appear as a combination of two semiconductor packages 1*r* of FIG. 17 disposed side by side. The first portion 15 and the second portion 16 are electrically connected to each other by the first circuitry 4. One or both of the semiconductor elements 2 may actually be passive components.

Figure 22:
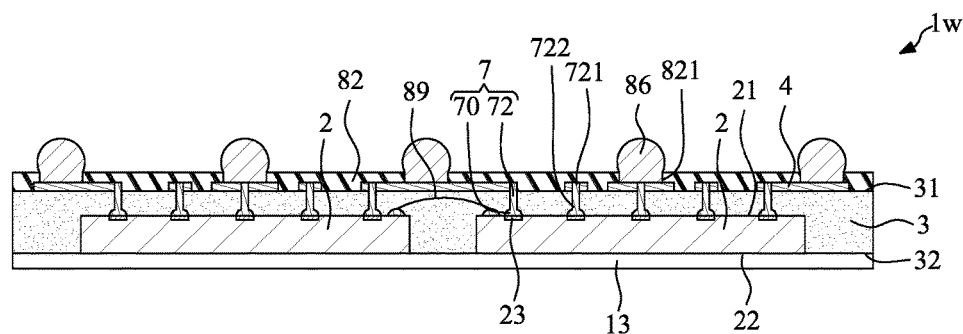
FIG. 22 depicts a cross-sectional view of an example of a semiconductor package according to some embodiments of the present disclosure.

FIG. 22 depicts a cross-sectional view of an example of a semiconductor package 1*w* according to some embodiments of the present disclosure. The semiconductor package 1*w* is similar to the semiconductor package 1*v* shown in FIG. 21, and similar features are numbered alike and not further described with respect to FIG. 22. The semiconductor package 1*w* of FIG. 22 includes an internal wire 89 for electrically connecting two semiconductor elements 2.

Figure 23:
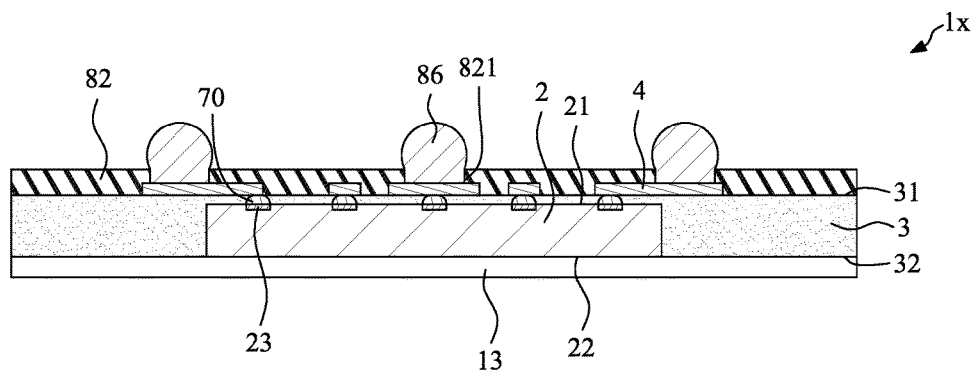
FIG. 23 depicts a cross-sectional view of an example of a semiconductor package according to some embodiments of the present disclosure.

FIG. 23 depicts a cross-sectional view of an example of a semiconductor package 1*x* according to some embodiments of the present disclosure. The semiconductor package 1*x* is similar to the semiconductor package 1*t* shown in FIG. 19, and similar features are numbered alike and not further described with respect to FIG. 23. In the semiconductor package 1*x* of FIG. 23, the stud portion 72 of the second stud bump 7 may be removed or may be not even formed during the bonding process. The bump portion 70 may remain. Thus, the first circuitry 4 may contact the bump portion 70. As a result, the overall thickness of the semiconductor package 1*x* of FIG. 23 is less than the overall thickness of the semiconductor package 1*t* of FIG. 19.

Figure 24:
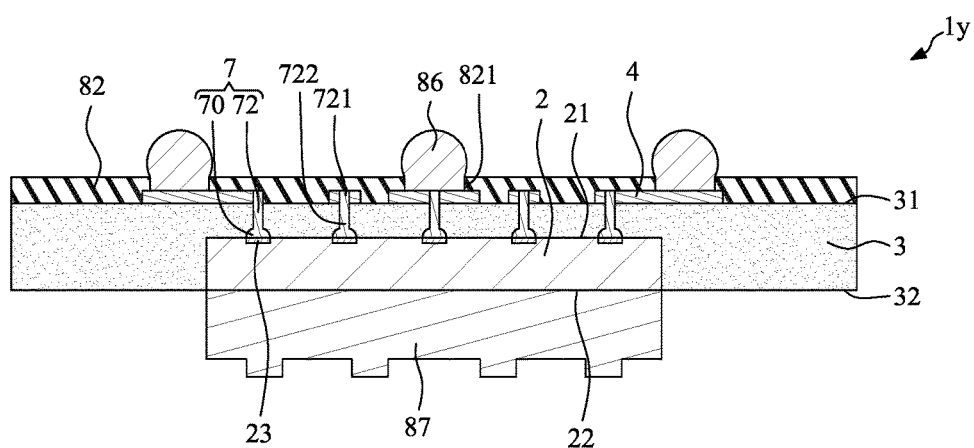
FIG. 24 depicts a cross-sectional view of an example of a semiconductor package according to some embodiments of the present disclosure.

FIG. 24 depicts a cross-sectional view of an example of a semiconductor package 1*y* according to some embodiments of the present disclosure. The semiconductor package 1*y* is similar to the semiconductor package 1*r* shown in FIG. 17, and similar features are numbered alike and not further described with respect to FIG. 24. In the semiconductor package 1*y* of FIG. 24, the lower adhesion layer 13 may be replaced by a heat sink 87. The heat sink 87 is attached to a position corresponding to (e.g., below or on top of) the semiconductor element 2 so as to dissipate the heat generated by the semiconductor element 2. As shown in FIG. 24, the heat sink 87 is attached to the backside surface 22 of the semiconductor element 2. The heat sink 87 may be a fin-type heat sink (including fins) so as to increase the heat dissipating area.

Figure 25:
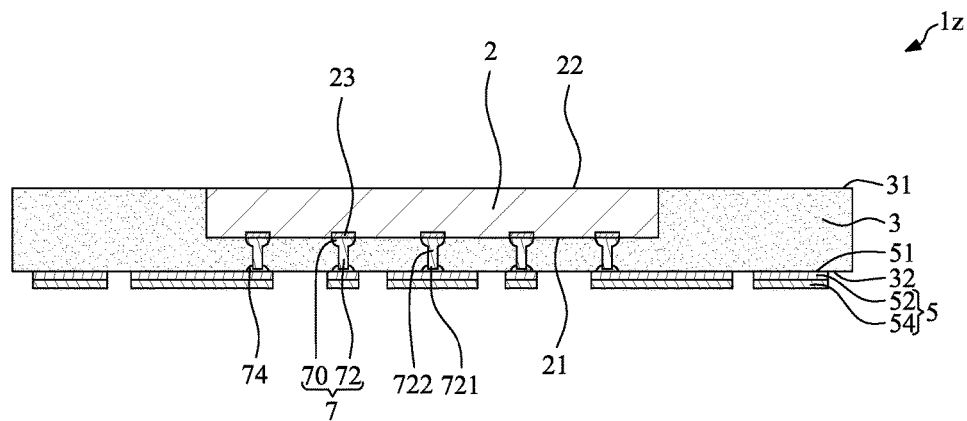
FIG. 25 depicts a cross-sectional view of an example of a semiconductor package according to some embodiments of the present disclosure.

FIG. 25 depicts a cross-sectional view of an example of a semiconductor package 1*z* according to some embodiments of the present disclosure. The semiconductor package 1*z* is similar to the semiconductor package 1*e* shown in FIG. 6, and similar features are numbered alike and not further described with respect to FIG. 25. In the semiconductor package 1*z* of FIG. 25, the first circuitry 4, the first stud bump 6, the first protection layer 82, the second protection layer 84 and the external connector (e.g., solder bump 86) of FIG. 6 may be omitted, according to some embodiments. The backside surface 22 of the semiconductor element 2 is substantially coplanar with the first surface 3 of the encapsulant 3.

Figure 26:
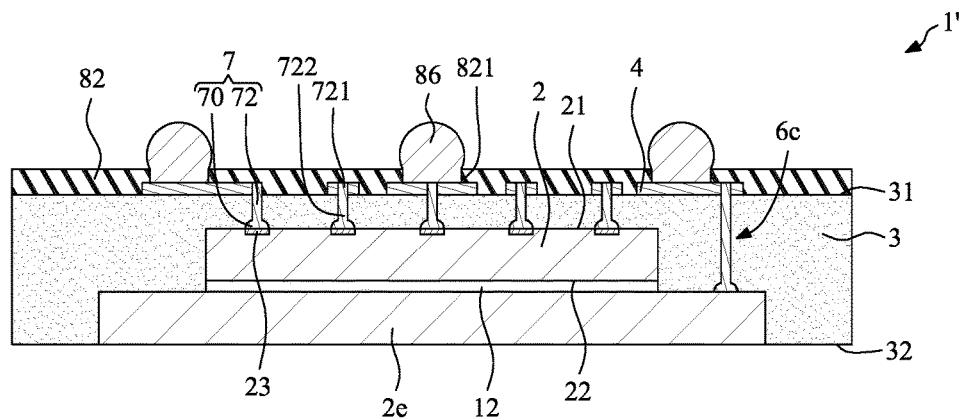
FIG. 26 depicts a cross-sectional view of an example of a semiconductor package according to some embodiments of the present disclosure.

FIG. 26 depicts a cross-sectional view of an example of a semiconductor package 1' according to some embodiments of the present disclosure. The semiconductor package 1' is similar to the semiconductor package 1*r* shown in FIG. 17, and similar features are numbered alike and not further described with respect to FIG. 26. The semiconductor package 1' of FIG. 26 includes two stacked semiconductor elements (i.e., the semiconductor element 2 and a bottom semiconductor element 2*e*). The semiconductor element 2 is attached to the bottom semiconductor element 2*e* through the adhesive layer 12. In addition, the semiconductor package 1' of FIG. 26 includes at least one seventh stud bump 6*c* disposed in the encapsulant 3. That is, the seventh stud bump 6*c* is covered or encapsulated by the encapsulant 3. The seventh stud bump 6*c* electrically connects the bottom semiconductor element 2*e* and the first circuitry 4.

Figure 27:
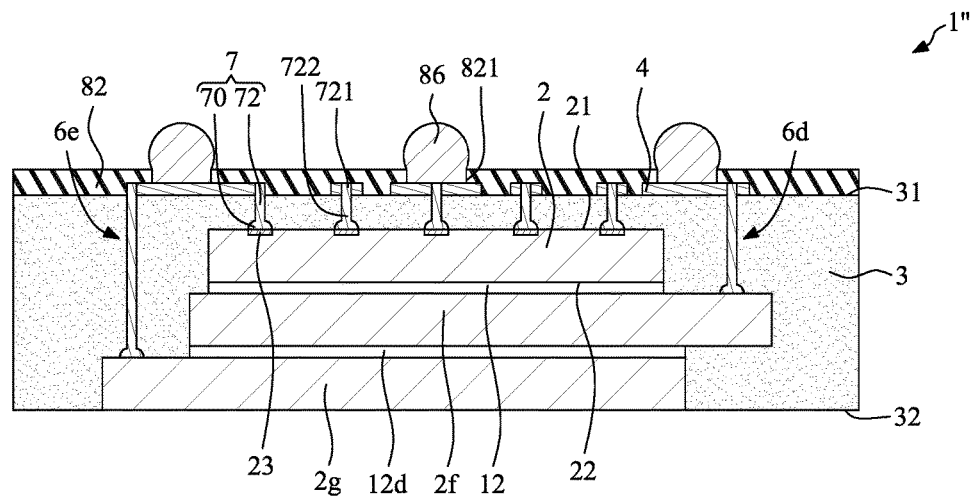
FIG. 27 depicts a cross-sectional view of an example of a semiconductor package according to some embodiments of the present disclosure.

FIG. 27 depicts a cross-sectional view of an example of a semiconductor package 1" according to some embodiments of the present disclosure. The semiconductor package 1" is similar to the semiconductor package 1*r* shown in FIG. 17, and similar features are numbered alike and not further described with respect to FIG. 27. The semiconductor package 1" of FIG. 27 includes three stacked semiconductor elements (i.e., the semiconductor element 2, an intermediate semiconductor element 2*f* and a lower semiconductor element 2*g*). The semiconductor element 2 is attached to the intermediate semiconductor element 2*f* through the adhesive layer 12, and the intermediate semiconductor element 2*f* is attached to the lower semiconductor element 2*g* through the adhesive layer 12*d*. In addition, the semiconductor package 1" of FIG. 27 includes at least one eighth stud bump 6*d* and at least one ninth stud bump 6*e* disposed in the encapsulant 3. That is, the eighth stud bump 6*d* and the ninth stud bump 6*e* are covered or encapsulated by the encapsulant 3. The eighth stud bump 6*d* electrically connects the intermediate semiconductor element 2*f* and the first circuitry 4. The ninth stud bump 6*e* electrically connects the lower semiconductor element 2*g* and the first circuitry 4.

Figure 28:
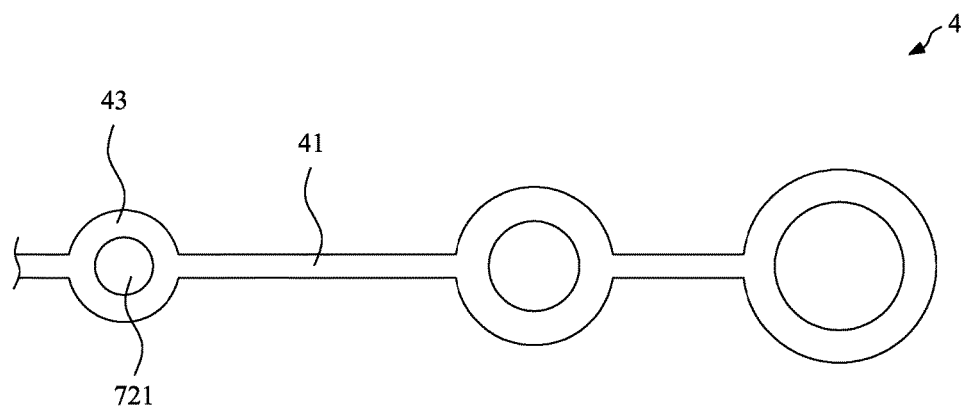
FIG. 28 depicts a top view of an example of a portion of the first circuitry of the semiconductor package of FIG. 1.

FIG. 28 depicts a top view of an example of a portion of the first circuitry 4 of the semiconductor package 1 of FIG. 1. As shown in FIG. 28, the first circuitry 4 includes at least one trace 41 and a plurality of bump lands 43. The bump land 43 may enclose the first end 721 of the stud portion 72 of the second stud bump 7 (FIG. 1). The dimension (e.g., diameter) of the bump land 43 may be greater than the dimension (e.g., diameter) of the first end 721 of the stud portion 72 of the second stud bump 7, and the dimension (e.g., diameter) of the bump pad 43 may be substantially in proportion with the dimension (e.g., diameter) of the first end 721 of the stud portion 72 of the second stud bump 7.

The trace 41 connects three bump lands 43 that have different dimensions (e.g., diameters).

Figure 29:
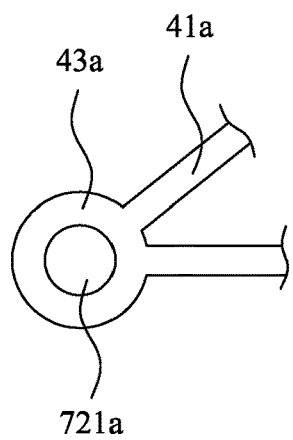
FIG. 29 depicts a top view of an example of a portion of the first circuitry of the semiconductor package of FIG. 1.

FIG. 29 depicts a top view of an example of a portion of the first circuitry 4 of the semiconductor package 1 of FIG. 1. As shown in FIG. 29, two traces 41a connect one bump land 43a (enclosing a first end 721a of the stud portion 72 of the second stud bump 7).

Figure 30A:
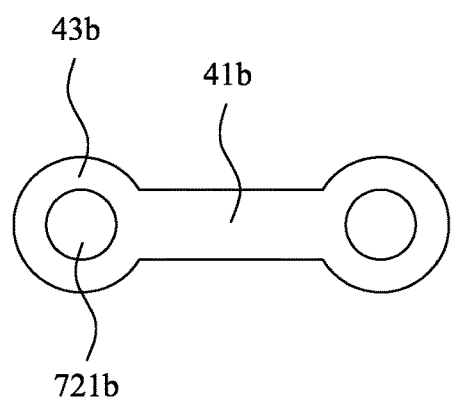
FIG. 30A depicts a top view of an example of a portion of the first circuitry of the semiconductor package of FIG. 1.

FIG. 30A depicts a top view of an example of a portion of the first circuitry 4 of the semiconductor package 1 of FIG. 1. As shown in FIG. 30A, one trace 41b connects two bump lands 43b. Each of the bump lands 43b encloses a first end 721b of the stud portion 72 of the second stud bump 7. The width of the trace 41b is substantially equal to the diameter of the first end 721b.

Figure 30B:
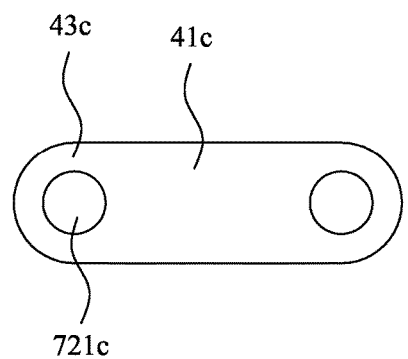
FIG. 30B depicts a top view of an example of a portion of the first circuitry of the semiconductor package of FIG. 1.

FIG. 30B depicts a top view of an example of a portion of the first circuitry 4 of the semiconductor package 1 of FIG. 1. As shown in FIG. 30B, one trace 41c connects two bump lands 43c. Each of the bump lands 43c encloses a first end 721c of the stud portion 72 of the second stud bump 7. The width of the trace 41c is greater than the diameter of the first end 721b, and the width of the trace 41c is substantially equal to the diameter of the bump pad 43c.

Figure 31:
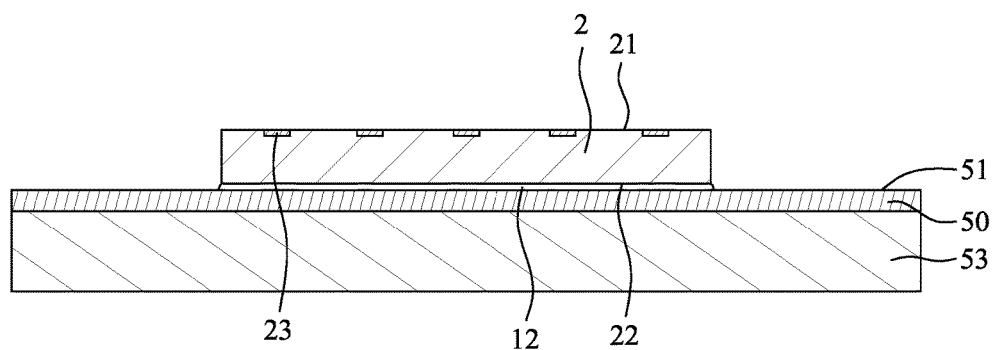
FIG. 31 depicts a cross-sectional view of an example semiconductor package at one or more stages during an example method for manufacturing a semiconductor package, according to some embodiments of the present disclosure.

FIGS. 31-40 depict cross-sectional views of an example semiconductor package at various stages during an example method for manufacturing the semiconductor package, according to some embodiments of the present disclosure. It is noted that the method disclosed in FIGS. 31-40 may be used to manufacture the semiconductor package 1 of FIG. 1. Referring to FIG. 31, in a die face-up process, a carrier 53 with a metal sheet 50 disposed on a surface of the carrier 53 is provided. The carrier 53 may be circular (e.g., wafer or the like) or rectangular (e.g., strip or panel), and may include a material that has a low coefficient of thermal expansion (CTE) to minimize mechanical stress and warpage. The material of the carrier 53 may be, for example, silicon, glass, metal (e.g., copper, stainless steel, copper-invar-copper, or a combination of two or more thereof), a laminate structure (e.g., grade FR4 laminate) or a resin (e.g., bismaleimide-triazine (BT)). The metal sheet 50 (e.g., copper foil) may be attached to the carrier 53 by an adhesion material according to a lamination process. The thickness of the metal sheet 50 may be, e.g., about 1 µm to about 500 µm, about 2 µm to about 200 µm, or about 3 µm to about 100 µm. A first surface 51 (which eventually forms the first surface 51 of the second circuitry 5) and a second surface (opposite to the first surface 51) of the metal sheet 50 have suitable uniformity (e.g., uniformity less than about 10%, about 5% or about 3% and TTV less than about 15 µm, about 10 µm, about 5 µm), and the surface roughness (Rz) of the top surface of the metal sheet 50 may be about 0.1 µm to about 10.0 µm, about 0.5 µm to about 7.0 µm, about 1.0 µm to about 3.0 µm, which may be an advantage for the formation of a first stud bump and the die attachment described below.

At least one semiconductor element 2 is attached to the first surface 51 of the metal sheet 50. The semiconductor element 2 may be, e.g., a semiconductor die or an electronic component (e.g., passive component). The semiconductor element 2 has an active surface 21, a backside surface 22 opposite to the active surface 21 and a plurality of pads 23. The active surface 21 faces upward with reference to the orientation shown in FIG. 31. The backside surface 22 is attached to the first surface 51 of the metal sheet 50 by the adhesive layer 12, and faces downward with reference to the orientation shown in FIG. 31. The pads 23 are disposed adjacent to the active surface 21 of the semiconductor element 2.

Figure 32:
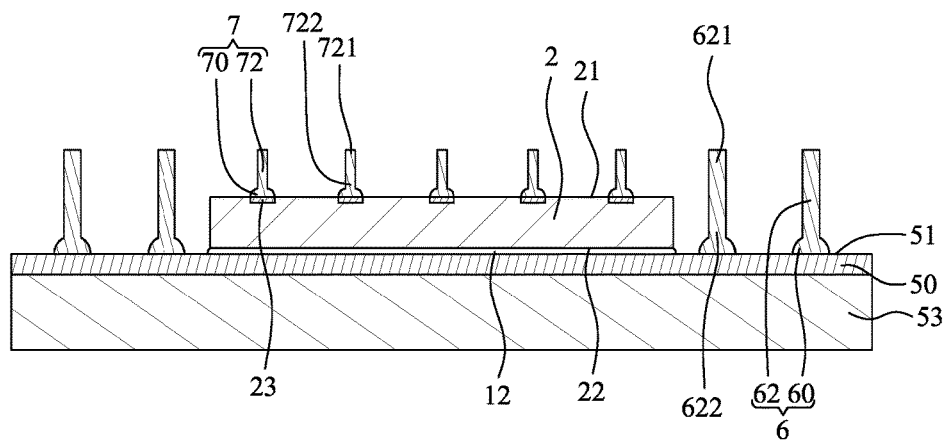
FIG. 32 depicts a cross-sectional view of an example semiconductor package at one or more stages during an example method for manufacturing a semiconductor package, according to some embodiments of the present disclosure.

Referring to FIG. 32, at least one first stud bump 6 is formed on the metal sheet 50. In addition, at least one conductive interconnector (e.g., second stud bump 7) is formed on the semiconductor element 2. The material of the first stud bump 6 may be, e.g., gold, copper, silver, platinum coated copper, or a combination thereof. As shown in FIG. 32, the first stud bump 6 contacts the metal sheet 50 directly. In one embodiment, the first stud bump 6 includes a stud portion 62 and a bump portion 60, wherein a width of the stud portion 62 is smaller than a width of the bump portion 60. It is noted that the stud portion 62 may be substantially in a pillar shape, and the bump portion 60 may be substantially in a disk shape. The stud portion 62 and the bump portion 60 may be formed concurrently and integrally by, e.g., a wire bonding apparatus. The bump portion 60 of the first stud bump 6 contacts the metal sheet 50 directly.

The stud portion 62 includes a first end 621 and a second end 622. The second end 622 of the stud portion 62 connects the bump portion 60. In one embodiment, the bump portion 60 is formed on the metal sheet 50 by a bonding head of the wire bonding apparatus. The bonding head moves upward to form the stud portion 62. The top portion of the stud portion 62 is cut off to form the first end 621.

As shown in FIG. 32, the conductive interconnector may be at least one second stud bump 7. The second stud bump 7 electrically connects and physically contacts the pads 23 of the semiconductor element 2. The material of the second stud bump 7 may be gold, copper, platinum coated copper, silver, or a combination of two or more thereof. In one embodiment, the second stud bump 7 includes a stud portion 72 and a bump portion 70, wherein a width of the stud portion 72 is smaller than a width of the bump portion 70. It is noted that the stud portion 72 may be substantially in a pillar shape, and the bump portion 70 may be substantially in a disk shape. The stud portion 72 and the bump portion 70 may be formed concurrently and integrally by, e.g., a wire bonding apparatus.

The stud portion 72 includes a first end 721 and a second end 722. The second end 722 of the stud portion 72 connects the bump portion 70. The widths of the stud portion 72 and the bump portion 70 of the second stud bump 7 are smaller than the widths of the stud portion 62 and the bump portion 60 of the first stud bump 6, respectively. In other embodiments, the widths of the stud portion 72 and the bump portion 70 of the second stud bump 7 may be substantially the same as the widths of the stud portion 62 and the bump portion 60 of the first stud bump 6, respectively. Further, the stud portion 72 of the second stud bump 7 may be substantially perpendicular to the active surface 21 of the semiconductor element 2. Similarly, the stud portion 62 of the first stud bump 6 may be substantially perpendicular to the first surface 51 of the metal sheet 50. In other embodiments, the stud portion 72 of the second stud bump 7 may not be perpendicular to the active surface 21 of the semiconductor element 2, and the stud portion 62 of the first stud bump 6 may not be perpendicular to the first surface 51 of the metal sheet 50.

Figure 33:
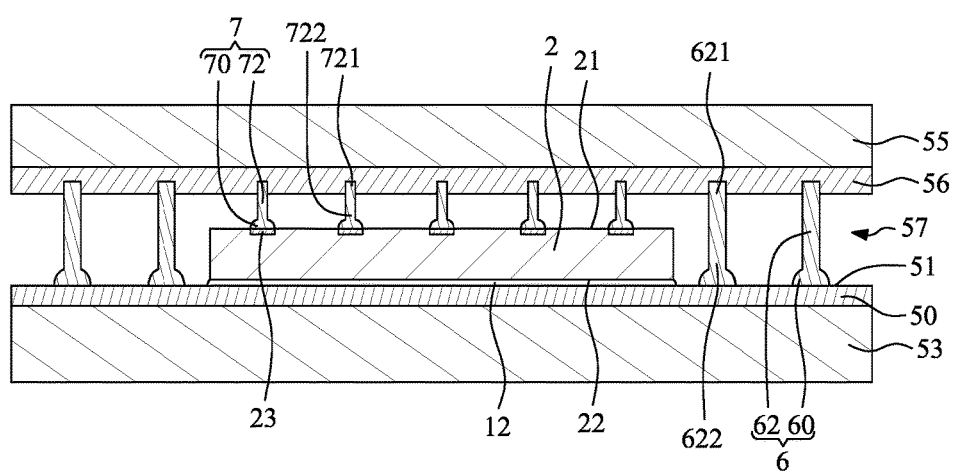
FIG. 33 depicts a cross-sectional view of an example semiconductor package at one or more stages during an example method for manufacturing a semiconductor package, according to some embodiments of the present disclosure.

Referring to FIG. 33, a top cover 55 with a buffer layer 56 disposed on a surface of the top cover 55 is provided. The top cover 55 may be circular (e.g., wafer or the like) or rectangular (e.g., strip or panel), and may include a material that has a low coefficient of thermal expansion (CTE) to minimize mechanical stress and warpage. The material of the top cover 55 may be, for example, silicon, glass, metal (e.g., copper or stainless steel), a laminate structure (e.g., model FR4 laminate), a resin (e.g., bismaleimide-triazine (BT)) or a combination of two or more thereof. The size and/or material of the top cover 55 may be substantially the same as or different from the size and/or material of the carrier 53. The material of the buffer layer 56 may include a soft material such as plastic. Then, the top cover 55 with the buffer layer 56 covers the first stud bump 6 and the conductive interconnector (e.g., second stud bump 7). Thus, the buffer layer 56 contacts and presses the first end 621 of the stud portion 62 of the first stud bump 6 and the first end 721 of the stud portion 72 of the second stud bump 7. In one embodiment, the first end 621 of the stud portion 62 of the first stud bump 6 and the first end 721 of the stud portion 72 of the second stud bump 7 may support and sustain the buffer layer 56 and the top cover 55. A space 57 is defined between the buffer layer 56 and the metal sheet 50.

Figure 33A:
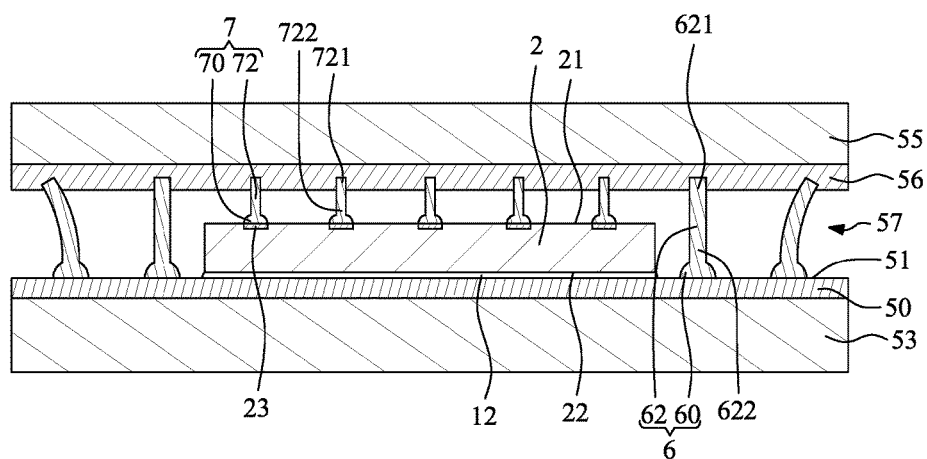
FIG. 33A depicts a cross-sectional view of an example semiconductor package at one or more stages during an example method for manufacturing a semiconductor package, according to some embodiments of the present disclosure.

Referring to FIG. 33A, in some embodiments, the first stud bumps 6 may have different heights, and some of the first stud bumps 6 may bend after being covered and pressed by the buffer layer 56 and the top cover 55.

Figure 34:
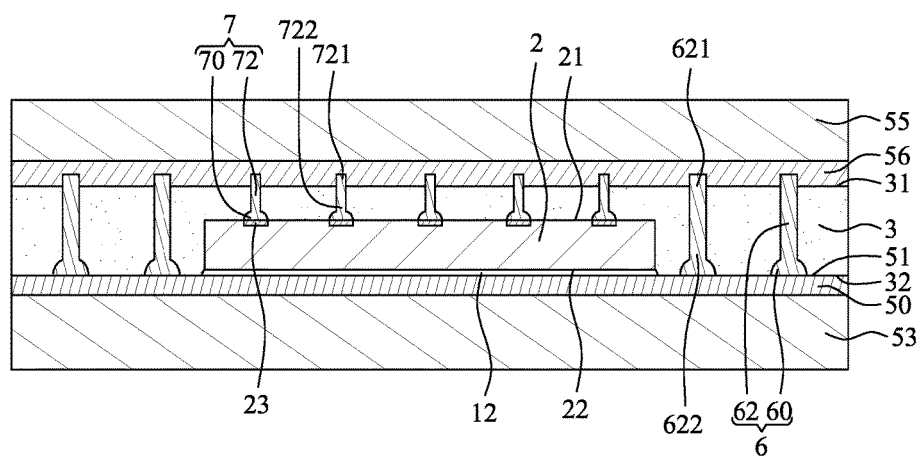
FIG. 34 depicts a cross-sectional view of an example semiconductor package at one or more stages during an example method for manufacturing a semiconductor package, according to some embodiments of the present disclosure.

Referring to FIG. 34, the encapsulant 3 is formed in a space 57 between the buffer layer 56 and the metal sheet 50. A material of the encapsulant 3 may include, e.g., a molding compound (such as epoxy resin with fillers), a photo-imageable dielectric (such as solder mask or other suitable dielectric materials), or a combination thereof. The encapsulant 3 has a first surface 31 and a second surface 32 opposite to the first surface 31. As shown in FIG. 34, the encapsulant 3 covers a portion of the active surface 21 of the semiconductor element 2, the lateral surface of the semiconductor element 2, the first stud bump 6, and the conductive interconnector (e.g., second stud bump 7). Thus, the semiconductor element 2 is embedded at least in part in the encapsulant 3. The thickness of the semiconductor element 2 is less than the thickness of the encapsulant 3. In one embodiment, the active surface 21 of the semiconductor element 2 faces toward the first surface 31 of the encapsulant 3, and the backside surface 22 of the semiconductor element 2 is disposed adjacent to the second surface 32 of the encapsulant 3. It is noted that the bottom surface of the adhesive layer 12 is substantially coplanar with the second surface 32 of the encapsulant 3.

Figure 35:
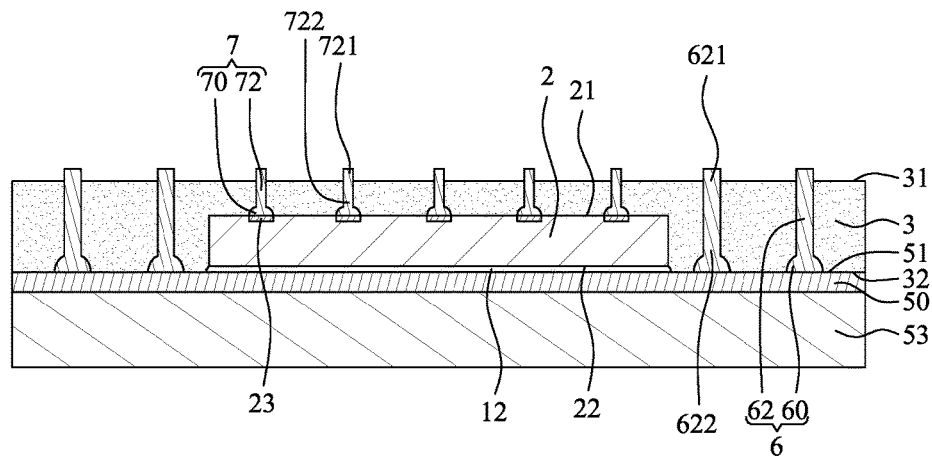
FIG. 35 depicts a cross-sectional view of an example semiconductor package at one or more stages during an example method for manufacturing a semiconductor package, according to some embodiments of the present disclosure.

Referring to FIG. 35, in some embodiments, the buffer layer 56 and the top cover 55 may be removed so as to expose the first stud bump 6 and the conductive interconnector (e.g., second stud bump 7) from the encapsulant 3. As shown in FIG. 35, the first end 621 of the stud portion 62 of the first stud bump 6 and the first end 721 of the stud portion 72 of the second stud bump 7 protrude from the first surface 31 of the encapsulant 3. That is, the first end 621 of the stud portion 62 of the first stud bump 6 and the first end 721 of the stud portion 72 of the second stud bump 7 extend past the first surface 31 of the encapsulant 3. The exposed portions of the first end 621 of the stud portion 62 of the first stud bump 6 and the first end 721 of the stud portion 72 of the second stud bump 7 may be cleaned and micro etched prior to further processing.

Figure 36:
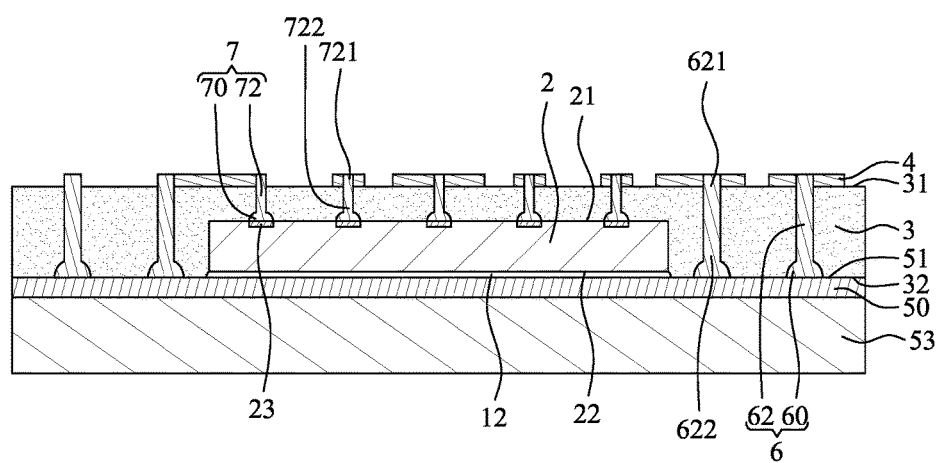
FIG. 36 depicts a cross-sectional view of an example semiconductor package at one or more stages during an example method for manufacturing a semiconductor package, according to some embodiments of the present disclosure.

Referring to FIG. 36, the first circuitry 4 (e.g., a redistribution layer) is formed on the first surface 31 of the encapsulant 3. The first circuitry 4 is disposed above the active surface 21 of the semiconductor element 2. Thus, the active surface 21 of the semiconductor element 2 faces the first circuitry 4. The first end 621 of the stud portion 62 of the first stud bump 6 contacts the first circuitry 4 so that the first circuitry 4 is electrically connected to the metal sheet 50. The first end 721 of the stud portion 72 of the second stud bump 7 contacts the first circuitry 4 so that the first circuitry 4 is electrically connected to the semiconductor element 2. In one embodiment, the first circuitry 4 may be formed by forming a seed layer on the first surface 31 of the encapsulant 3, pattern-plating a metal layer on the seed layer, and flash-etching the seed layer. The material of the seed layer maybe, e.g., titanium-copper (TiCu), and the material of the plated metal layer may be, e.g., copper (Cu).

Figure 37:
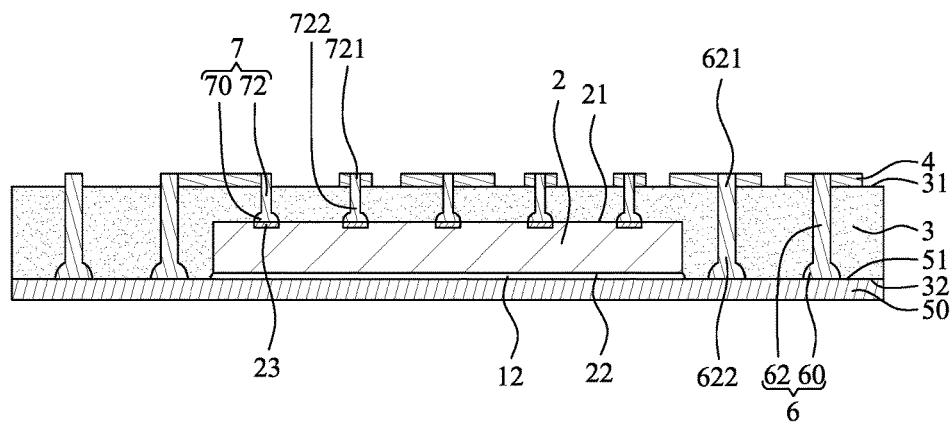
FIG. 37 depicts a cross-sectional view of an example semiconductor package at one or more stages during an example method for manufacturing a semiconductor package, according to some embodiments of the present disclosure.

Referring to FIG. 37, the carrier 53 is removed from the metal sheet 50. If desired, a temporary carrier may be bonded to the top side to provide a desired mechanical strength during subsequent processing. In one embodiment, the metal sheet 50 may remain and be patterned to be a portion of a circuitry. That is, the metal sheet 50 may not be completely removed, and a portion of the metal sheet 50 may remain in the final product. Thus, the difficulty and cost of a manufacturing process is reduced.

Figure 38:
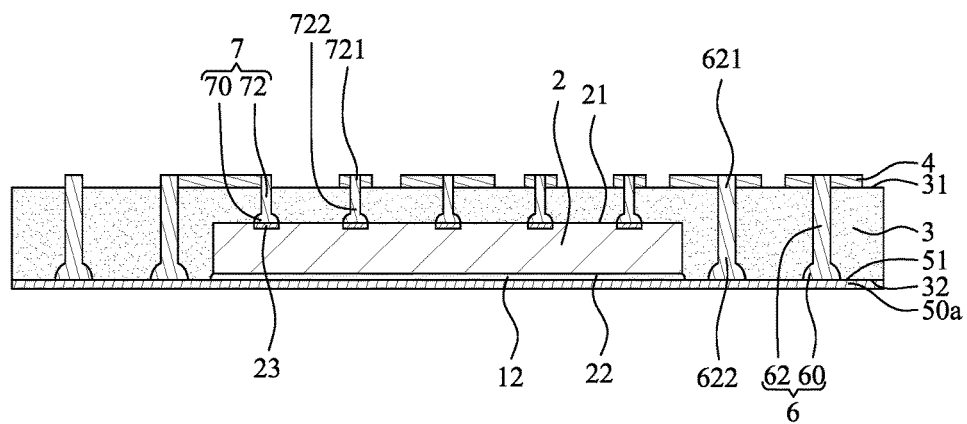
FIG. 38 depicts a cross-sectional view of an example semiconductor package at one or more stages during an example method for manufacturing a semiconductor package, according to some embodiments of the present disclosure.
Figure 40:
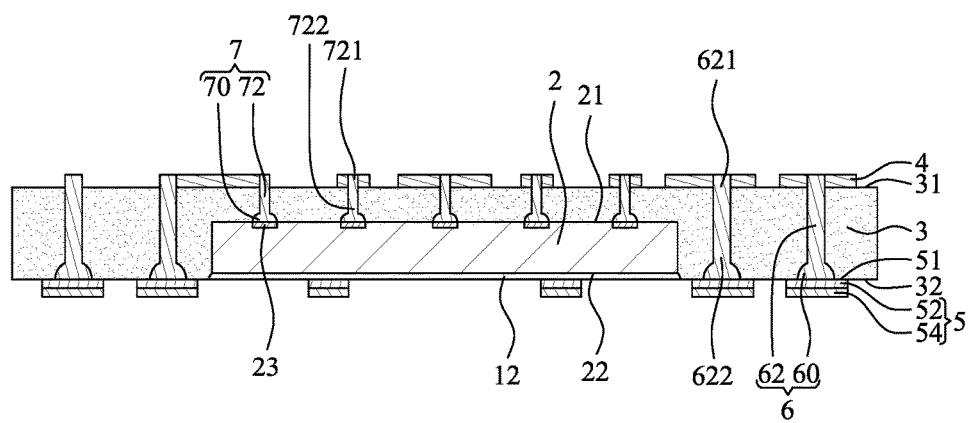
FIG. 40 depicts a cross-sectional view of an example semiconductor package at one or more stages during an example method for manufacturing a semiconductor package, according to some embodiments of the present disclosure.

Referring to FIG. 38, the metal sheet 50 is thinned to form a thinned metal sheet 50*a* by, for example, etching. Some of the advantages of the thinning stage are described as follows. First, a thickness of the second circuitry 5 (as shown in FIG. 40) formed from the thinned metal sheet 50*a* is low. Thus, the second circuitry 5 (as shown in FIG. 40) has a fine pitch in comparison with a circuitry without the thinning stage. Second, during the thinning stage, the amount of the metal sheet 50 being removed is relatively small. Thus, the processing time of the thinning stage is reduced.

Figure 39:
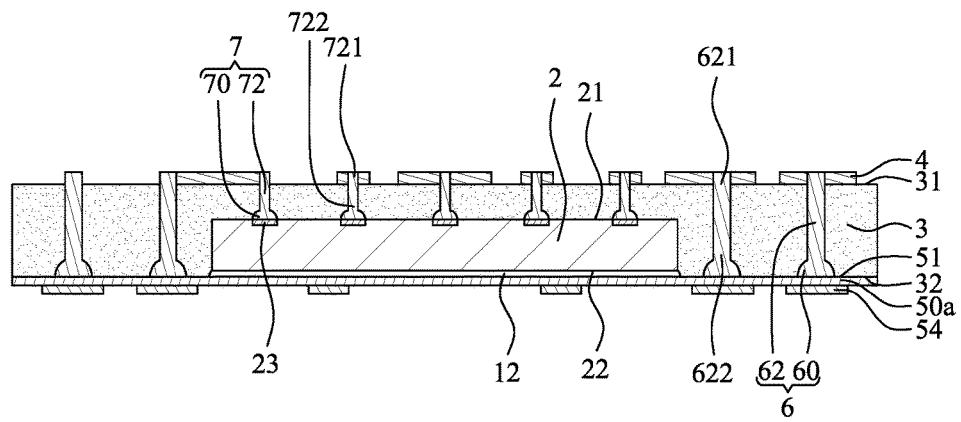
FIG. 39 depicts a cross-sectional view of an example semiconductor package at one or more stages during an example method for manufacturing a semiconductor package, according to some embodiments of the present disclosure.

Referring to FIG. 39, a patterned surface layer 54 is formed on the thinned metal sheet 50*a* by, for example, pattern-plating.

Referring to FIG. 40, at least a portion of the thinned metal sheet 50*a* is removed and patterned. That is, the thinned metal sheet 50*a* is patterned to form a base layer 52 by, for example, flash-etching so that the base layer 52 is conformal with the surface layer 54. Meanwhile, a second circuitry 5 is formed. The second circuitry 5 (e.g., a redistribution layer (RDL)) is disposed on the second surface 32 of the encapsulant 3, and is electrically connected to the first circuitry 4. The second circuitry 5 is disposed under the backside surface 22 of the semiconductor element 2. Thus, the backside surface 22 of the semiconductor element 2 faces the second circuitry 5. The adhesive layer 12 is interposed between the backside surface 22 of the semiconductor element 2 and the second circuitry 5. The second circuitry 5 includes the base layer 52 and the surface layer 54. The surface layer 54 is disposed on the base layer 52. Thus, the base layer 52 is interposed between the surface layer 54 and the second surface 32 of the encapsulant 3. Alternatively, the base layer 52 may be interposed between the surface layer 54 and the adhesive layer 12. The metal sheet 50 may be, e.g., a copper (Cu) foil. Thus, the base layer 52 may be a portion of the Cu foil. The surface layer 54 may be or include, e.g., plated Cu or other suitable material. The thickness of the base layer 52 may be, e.g., about 0.5 µm to about 200 µm, about 1.0 µm to about 100 µm, or about 1.5 µm to about 50 µm.

The second circuitry 5 has a first surface 51 (e.g., the top surface of the base layer 52) contacting the second surface 32 of the encapsulant 3 and/or the bottom surface of the adhesive layer 12. Since the base layer 52 of the second circuitry 5 is formed by patterning the thinned metal sheet 50*a*, the surface condition (e.g., Rz, uniformity and/or TTV) may not depend upon the surface conditions of the second surface 32 of the encapsulant 3 and/or the bottom surface of the adhesive layer 12. Thus, the surface condition (e.g., Rz, uniformity and/or TTV) of the base layer 52 of the second circuitry 5 may be more suitable for the manufacturing process than the surface condition of a plated or sputtered circuitry.

A first protection layer 82 and a second protection layer 84 are formed so as to obtain the semiconductor package 1 as shown in FIG. 1. The first protection layer 82, such as a solder mask, is formed to cover the first circuitry 4 and the first surface 31 of the encapsulant 3. The first protection layer 82 defines a plurality of openings 821 that expose a portion of the first circuitry 4 for external connection. At least one external connector (e.g., solder bump 86) is disposed in the openings 821 on the first circuitry 4. The second protection layer 84, such as a solder mask, is formed to cover the second circuitry 5, the second surface 32 of the encapsulant 3 and the adhesive layer 12. The second protection layer 84 defines a plurality of openings 841 that expose a portion of the second circuitry 5 for external connection.

Figure 41:
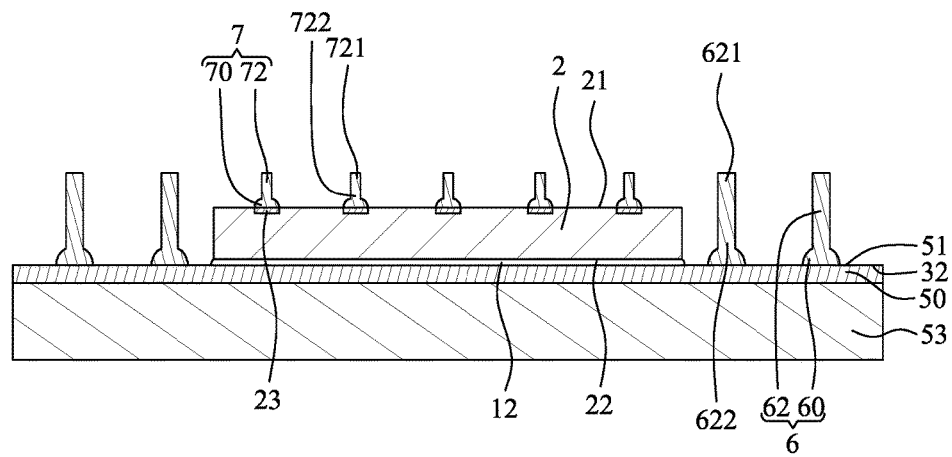
FIG. 41 depicts a cross-sectional view of an example semiconductor package at one or more stages during an example method for manufacturing a semiconductor package, according to some embodiments of the present disclosure.

FIGS. 41-46 depict cross-sectional views of an example semiconductor package at various stages during an example method for manufacturing the semiconductor package, according to some embodiments of the present disclosure. It is noted that the method disclosed in FIGS. 41-46 may be used to manufacture, e.g., the semiconductor package 1a of FIG. 2. Referring to FIG. 41, in a die face-up process, the backside surface 22 of the semiconductor element 2 is attached to the first surface 51 of the metal sheet 50 on the carrier 53. Then, the first stud bump 6 is formed on the metal sheet 50, and the conductive interconnector (e.g., second stud bump 7) is formed on the semiconductor element 2. It is noted that the stage of FIG. 41 may be substantially the same as the stage of FIG. 32.

Figure 42:
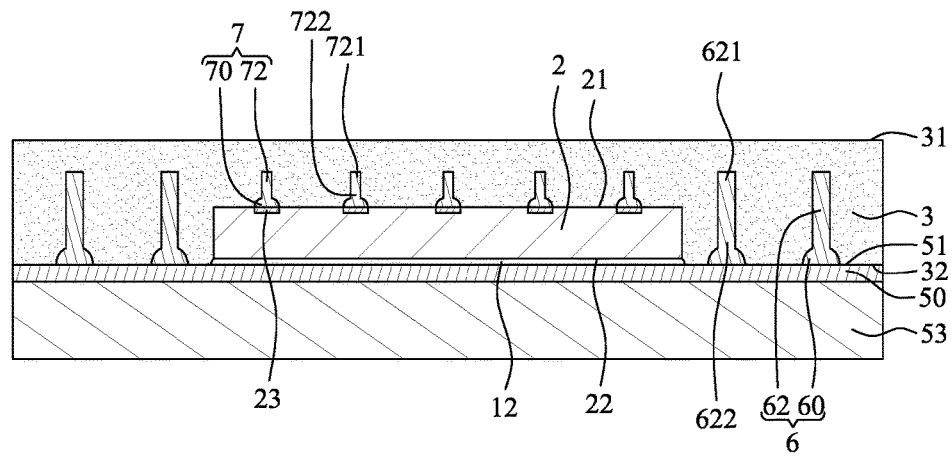
FIG. 42 depicts a cross-sectional view of an example semiconductor package at one or more stages during an example method for manufacturing a semiconductor package, according to some embodiments of the present disclosure.

Referring to FIG. 42, the encapsulant 3 is formed to cover a portion of the active surface 21 of the semiconductor element 2, the lateral surface of the semiconductor element 2, the first stud bump 6, and the conductive interconnector (e.g., second stud bump 7). In one embodiment, the encapsulant 3 may be formed by, e.g., an over-molding process. The encapsulant 3 has a first surface 31 and a second surface 32 opposite to the first surface 31. As shown in FIG. 42, the first surface 31 of the encapsulant 3 is higher than the first end 621 of the stud portion 62 of the first stud bump 6 and the first end 721 of the stud portion 72 of the second stud bump 7, with reference to the orientation shown in FIG. 42.

Figure 43:
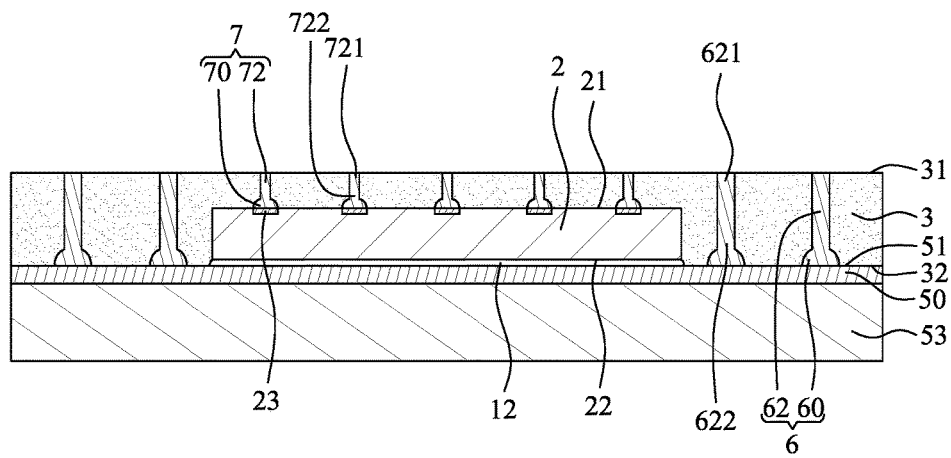
FIG. 43 depicts a cross-sectional view of an example semiconductor package at one or more stages during an example method for manufacturing a semiconductor package, according to some embodiments of the present disclosure.

Referring to FIG. 43, the encapsulant 3 is thinned from its first surface 31 to expose the first end 621 of the stud portion 62 of the first stud bump 6 and the first end 721 of the stud portion 72 of the second stud bump 7 from the first surface 31 of the encapsulant 3 by, for example, grinding. As a result, the top surface of the first end 621 of the stud portion 62 and the top surface of the first end 721 of the stud portion 72 are substantially coplanar with the first surface 31 of the encapsulant 3.

Figure 44:
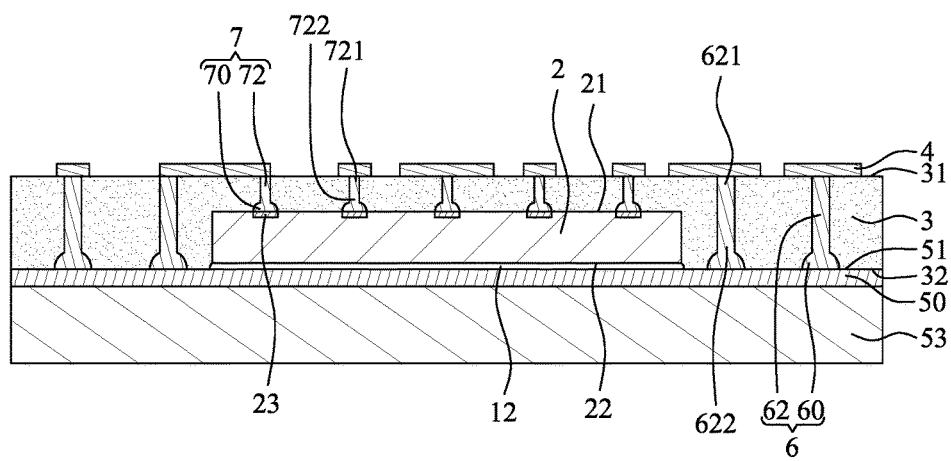
FIG. 44 depicts a cross-sectional view of an example semiconductor package at one or more stages during an example method for manufacturing a semiconductor package, according to some embodiments of the present disclosure.

Referring to FIG. 44, the first circuitry 4 is formed on the first surface 31 of the encapsulant 3. The top surface of the first end 621 of the stud portion 62 of the first stud bump 6 contacts the first circuitry 4 so that the first circuitry 4 is electrically connected to the metal sheet 50. The top surface of the first end 721 of the stud portion 72 of the second stud bump 7 contacts the first circuitry 4 so that the first circuitry 4 is electrically connected to the semiconductor element 2.

Figure 45:
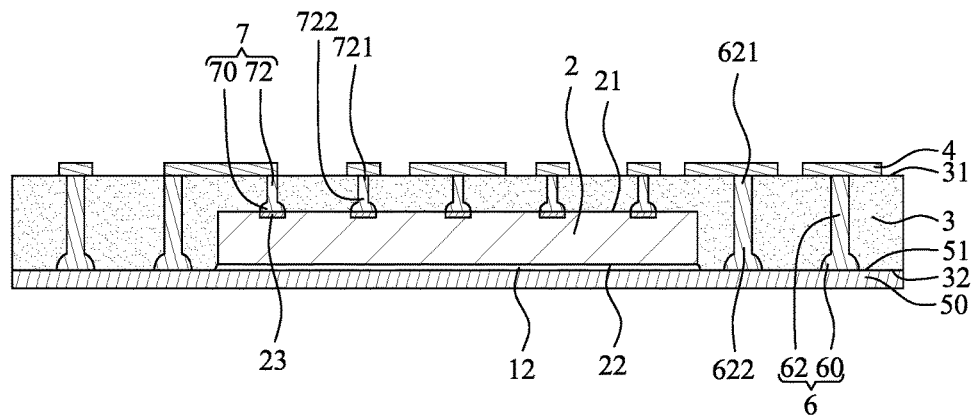
FIG. 45 depicts a cross-sectional view of an example semiconductor package at one or more stages during an example method for manufacturing a semiconductor package, according to some embodiments of the present disclosure.

Referring to FIG. 45, the carrier 53 is removed from the metal sheet 50. In some embodiments, a temporary carrier may be attached to the top side to provide a desired mechanical rigidity during subsequent processing.

Figure 46:
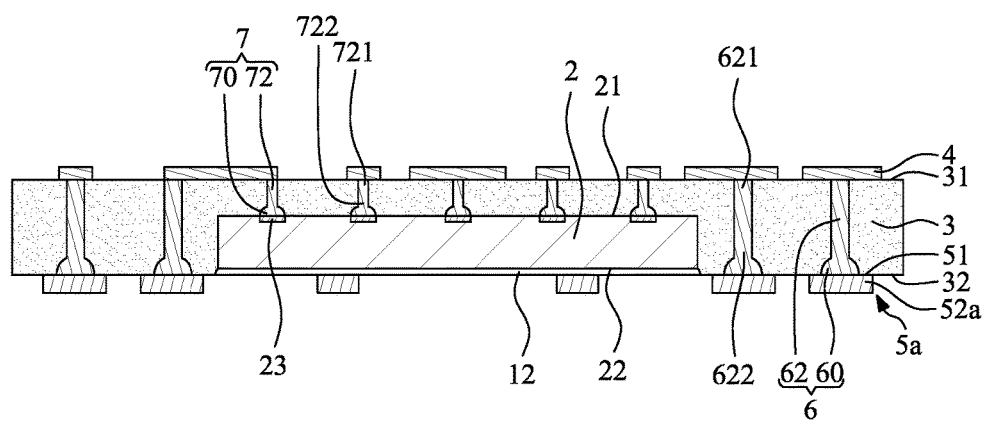
FIG. 46 depicts a cross-sectional view of an example semiconductor package at one or more stages during an example method for manufacturing a semiconductor package, according to some embodiments of the present disclosure.

Referring to FIG. 46, the metal sheet 50 is patterned to form the base layer 52a by, for example, selectively etching. Meanwhile, a second circuitry 5a is formed. Thus, the second circuitry 5a may include the base layer 52a patterned from the metal sheet 50 directly without a thinning stage. That is, the second circuitry 5a is a single layer with a monolithic structure.

A first protection layer 82 and a second protection layer 84 are formed so as to obtain the semiconductor package 1a as shown in FIG. 2.

Figure 47:
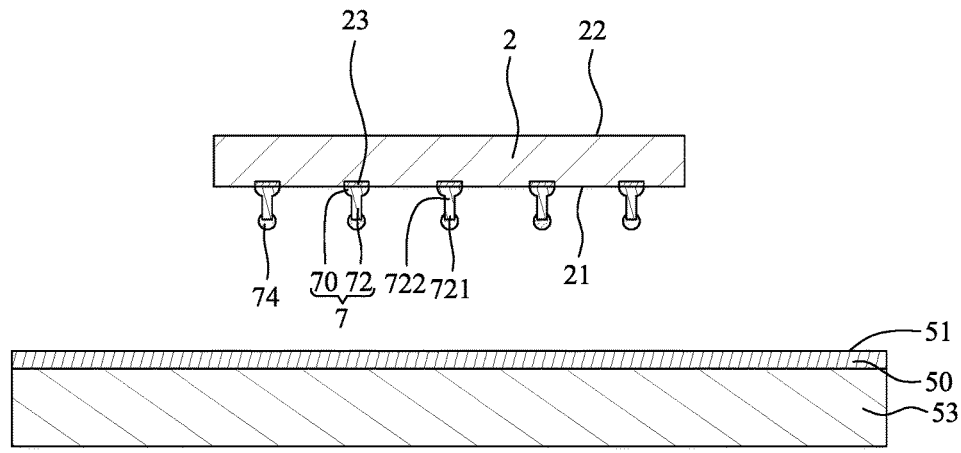
FIG. 47 depicts a cross-sectional view of an example semiconductor package at one or more stages during an example method for manufacturing a semiconductor package, according to some embodiments of the present disclosure.

FIGS. 47-54 depict cross-sectional views of an example semiconductor package at various stages during an example method for manufacturing the semiconductor package, according to some embodiments of the present disclosure. It is noted that the method disclosed in FIGS. 47-54 may be used to manufacture, e.g., the semiconductor package 1e of FIG. 6. Referring to FIG. 47, in a die face-down process, the active surface 21 of the semiconductor element 2 and the conductive interconnector (e.g., second stud bump 7) face the first surface 51 of the metal sheet 50 on the carrier 53.

Figure 48:
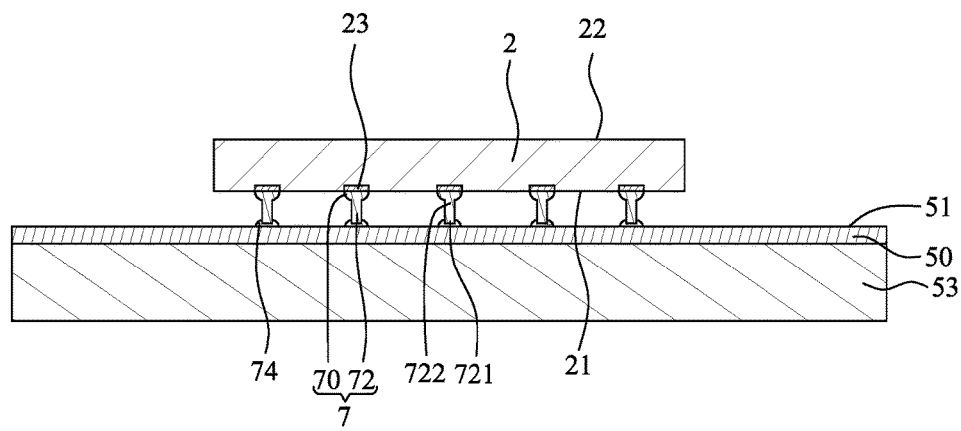
FIG. 48 depicts a cross-sectional view of an example semiconductor package at one or more stages during an example method for manufacturing a semiconductor package, according to some embodiments of the present disclosure.

Referring to FIG. 48, the active surface 21 of the semiconductor element 2 is electrically connected to the first surface 51 of the metal sheet 50 on the carrier 53 through the conductive interconnector (e.g., second stud bump 7). In one embodiment, the first end 721 of the stud portion 72 of the second stud bump 7 is electrically connected to the metal sheet 50 through a solder 74. In some embodiments, the solder target that lands on the metal sheet 50 may be pre-formed by, e.g., nickel-gold (NiAu) or alike to facilitate a controlled solder wetting.

Figure 49:
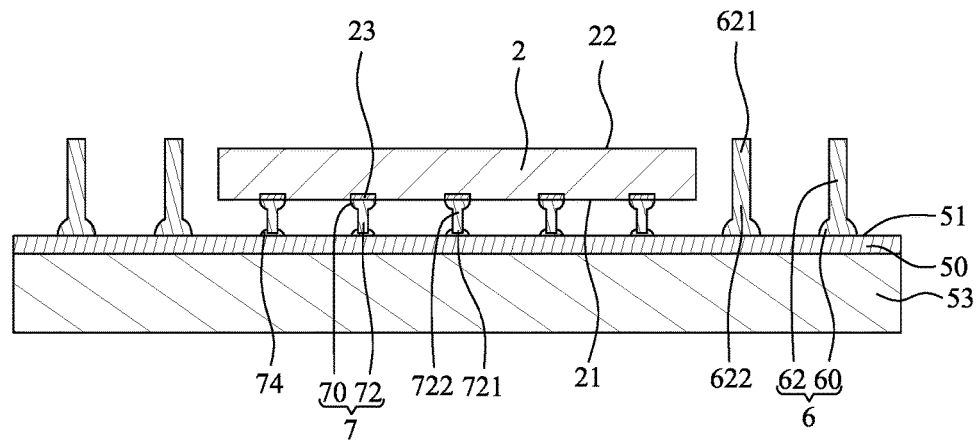
FIG. 49 depicts a cross-sectional view of an example semiconductor package at one or more stages during an example method for manufacturing a semiconductor package, according to some embodiments of the present disclosure.

Referring to FIG. 49, the first stud bump 6 is formed on the metal sheet 50. As shown in FIG. 49, the first stud bump 6 contacts the metal sheet 50 directly.

Figure 50:
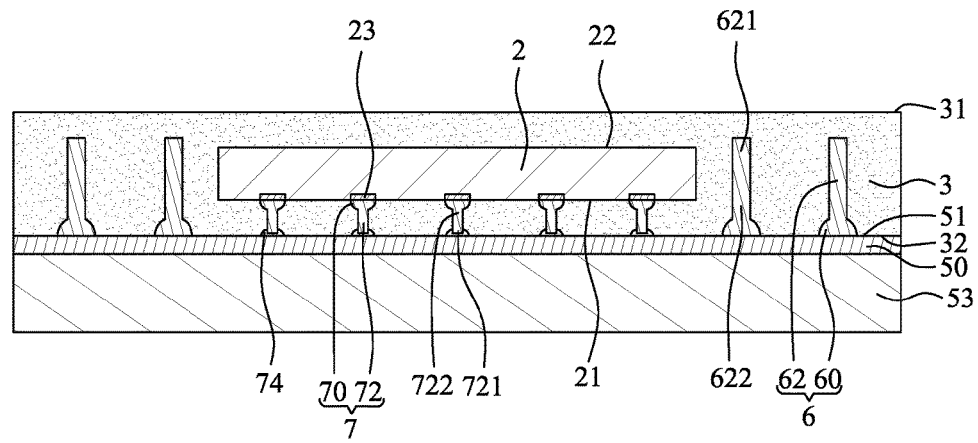
FIG. 50 depicts a cross-sectional view of an example semiconductor package at one or more stages during an example method for manufacturing a semiconductor package, according to some embodiments of the present disclosure.

Referring to FIG. 50, the encapsulant 3 is formed to cover the semiconductor element 2, the first stud bump 6, and the conductive interconnector (e.g., second stud bump 7). In one embodiment, the encapsulant 3 may be formed by, e.g., an over-molding process. As shown in FIG. 50, the first surface 31 of the encapsulant 3 may be higher than the first end 621 of the stud portion 62 of the first stud bump 6 and the backside surface 22 of the semiconductor element 2, with reference to the orientation shown in FIG. 50.

Figure 51:
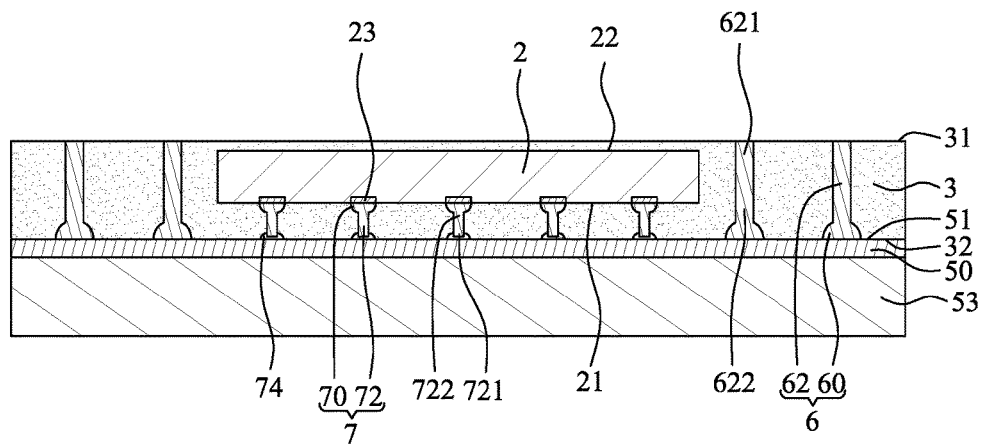
FIG. 51 depicts a cross-sectional view of an example semiconductor package at one or more stages during an example method for manufacturing a semiconductor package, according to some embodiments of the present disclosure.
Figure 51A:
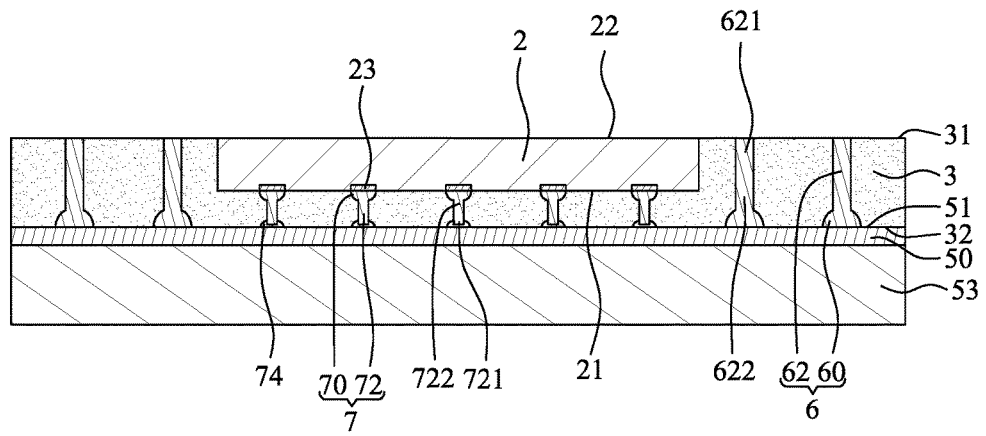
FIG. 51A depicts a cross-sectional view of an example semiconductor package at one or more stages during an example method for manufacturing a semiconductor package, according to some embodiments of the present disclosure.

Referring to FIG. 51, the encapsulant 3 is thinned from its first surface 31 to expose the first end 621 of the stud portion 62 of the first stud bump 6 from the first surface 31 of the encapsulant 3 by, for example, grinding. As a result, the top surface of the first end 621 of the stud portion 62 is substantially coplanar with the first surface 31 of the encapsulant 3. In one embodiment, the encapsulant 3 is further thinned from its first surface 31 to expose the backside surface 22 of the semiconductor element 2 so that the backside surface 22 of the semiconductor element 2 is substantially coplanar with the first surface 31 of the encapsulant 3 (as shown in FIG. 51A).

Figure 52:
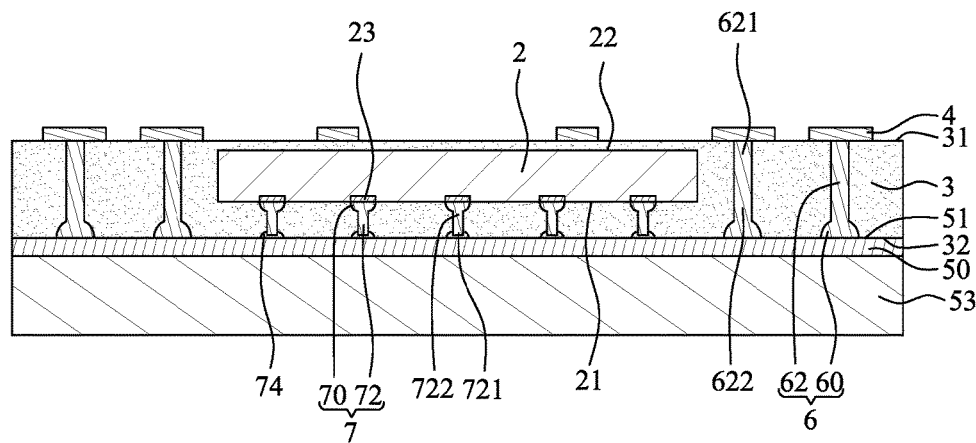
FIG. 52 depicts a cross-sectional view of an example semiconductor package at one or more stages during an example method for manufacturing a semiconductor package, according to some embodiments of the present disclosure.

Referring to FIG. 52, the first circuitry 4 is formed on the first surface 31 of the encapsulant 3. The top surface of the first end 621 of the stud portion 62 of the first stud bump 6 contacts the first circuitry 4 so that the first circuitry 4 is electrically connected to the metal sheet 50.

Figure 53:
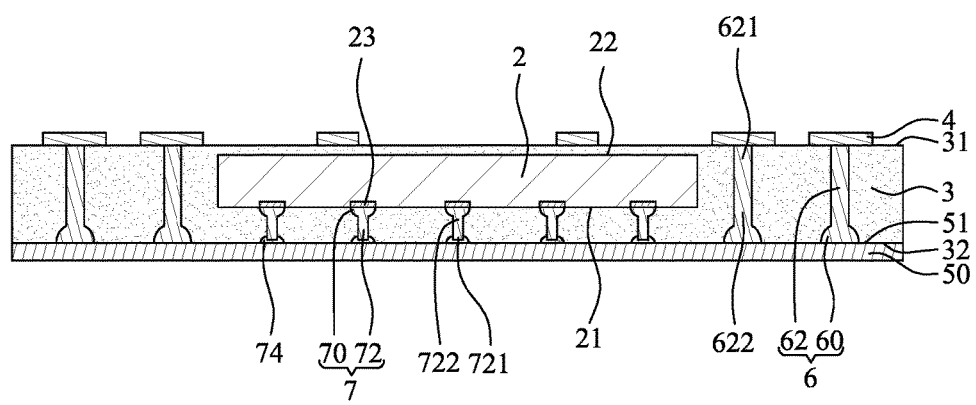
FIG. 53 depicts a cross-sectional view of an example semiconductor package at one or more stages during an example method for manufacturing a semiconductor package, according to some embodiments of the present disclosure.

Referring to FIG. 53, the carrier 53 is removed from the metal sheet 50. A sacrificial carrier may be bonded to the top side with the first circuitry 4 to provide a desired mechanical strength during subsequent processing.

Figure 54:
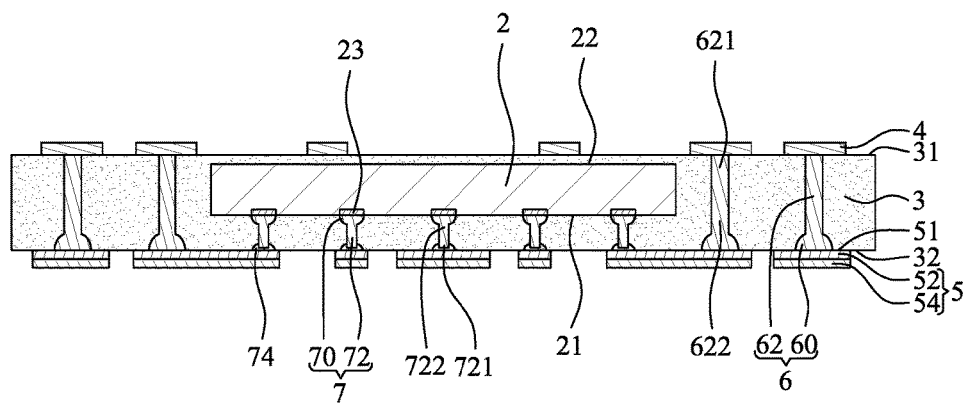
FIG. 54 depicts a cross-sectional view of an example semiconductor package at one or more stages during an example method for manufacturing a semiconductor package, according to some embodiments of the present disclosure.

Referring to FIG. 54, in some embodiments, the second circuitry 5 may be formed by the same stages as illustrated in FIGS. 38-40.

Then, the first protection layer 82 and the second protection layer 84 are formed so as to obtain the semiconductor package 1e as shown in FIG. 6.

Figure 55:
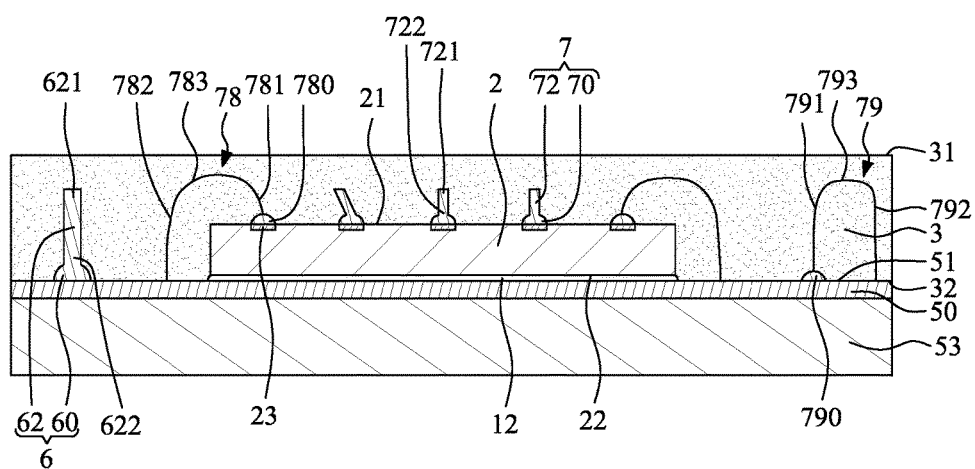
FIG. 55 depicts a cross-sectional view of an example semiconductor package at one or more stages during an example method for manufacturing a semiconductor package, according to some embodiments of the present disclosure.

FIGS. 55-58 depict cross-sectional views of an example semiconductor package at various stages during an example method for manufacturing the semiconductor package, according to some embodiments of the present disclosure. It is noted that the method disclosed in FIGS. 55-58 may be used to manufacture, e.g., the semiconductor package 1*i* of FIG. 10. Referring to FIG. 55, in a die face-up process, the backside surface 22 of the semiconductor element 2 is attached to the first surface 51 of the metal sheet 50 on the carrier 53. Then, the first stud bump 6 is formed on the metal sheet 50, and the conductive interconnector (e.g., second stud bump 7) is formed on the semiconductor element 2. It is noted that the stud portion 72 of some of the second stud bump 7 is not perpendicular to the active surface 21 of the semiconductor element 2. That is, there is an acute angle formed between the stud portion 72 of the second stud bump 7 and the active surface 21 of the semiconductor element 2.

In addition, single bonding wires 78, 79 are formed. The single bonding wire 78 connects the active surface 21 of the semiconductor element 2 the metal sheet 50, and includes a first wire segment 781, a second wire segment 782 and an intermediate wire segment 783. Both ends of the single bonding wire 79 connect the metal sheet 50. The single bonding wire 79 includes a third wire segment 791, a fourth wire segment 792 and an intermediate wire segment 793.

The encapsulant 3 is formed to cover a portion of the active surface 21 of the semiconductor element 2, the lateral surface of the semiconductor element 2, the first stud bump 6, the conductive interconnector (e.g., second stud bump 7), and the single bonding wires 78, 79. In one embodiment, the encapsulant 3 may be formed by, e.g., an over-molding process. The encapsulant 3 has a first surface 31 and a second surface 32 opposite to the first surface 31. As shown in FIG. 55, the first surface 31 of the encapsulant 3 is higher than the first end 621 of the stud portion 62 of the first stud bump 6, the first end 721 of the stud portion 72 of the second stud bump 7 and the intermediate wire segments 783, 793 with reference to the orientation shown in FIG. 55.

Figure 56:
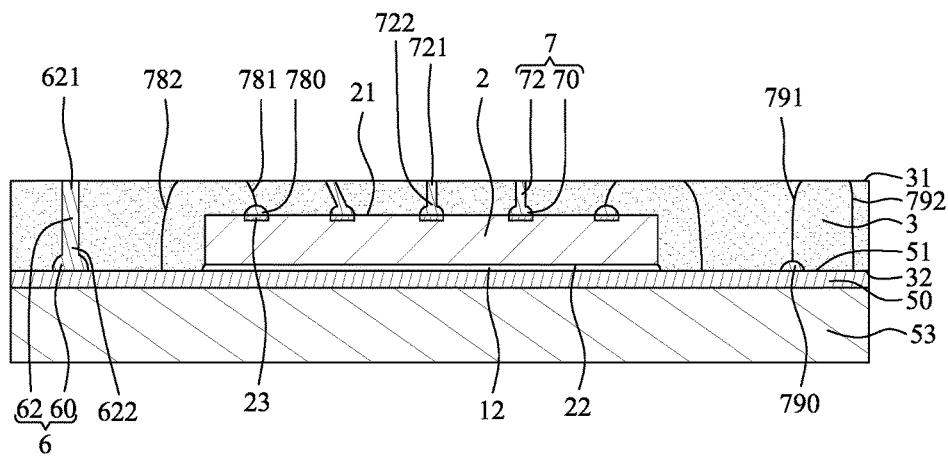
FIG. 56 depicts a cross-sectional view of an example semiconductor package at one or more stages during an example method for manufacturing a semiconductor package, according to some embodiments of the present disclosure.

Referring to FIG. 56, the encapsulant 3 is thinned from its first surface 31 to expose the first end 621 of the stud portion 62 of the first stud bump 6, the first end 721 of the stud portion 72 of the second stud bump 7 and portions of the single bonding wires 78, 79 from the first surface 31 of the encapsulant 3 by, for example, grinding. As a result, the top surface of the first end 621 of the stud portion 62 and the top surface of the first end 721 of the stud portion 72 are substantially coplanar with the first surface 31 of the encapsulant 3. Further, the intermediate wire segments 783, 793 are removed so that the first wire segment 781 and the second wire segment 782 are individual segments that are separate from each other, and the third wire segment 791 and the fourth wire segment 792 are individual segments that are separate from each other.

Figure 57:
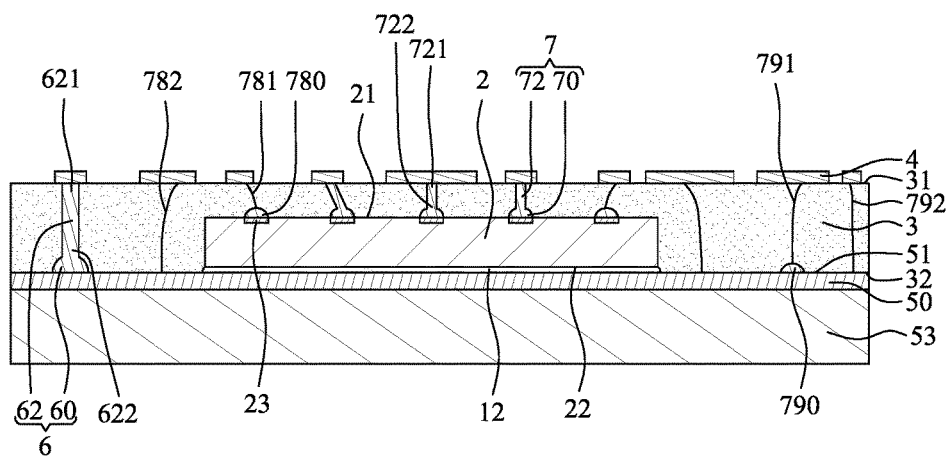
FIG. 57 depicts a cross-sectional view of an example semiconductor package at one or more stages during an example method for manufacturing a semiconductor package, according to some embodiments of the present disclosure.

Referring to FIG. 57, the first circuitry 4 is formed on the first surface 31 of the encapsulant 3. The top surface of the first end 621 of the stud portion 62 of the first stud bump 6 contacts the first circuitry 4 so that the first circuitry 4 is electrically connected to the metal sheet 50. The top surface of the first end 721 of the stud portion 72 of the second stud bump 7 contacts the first circuitry 4 so that the first circuitry 4 is electrically connected to the semiconductor element 2. Further, the first wire segment 781 electrically connects the first circuitry 4 and the semiconductor element 2. One end of the first wire segment 781 connects the pad 23 of the semiconductor element 2 through a bump portion 780, and the other end of the first wire segment 781 connects the bottom surface of the first circuitry 4. One end of the second wire segment 782 connects the bottom surface of the first circuitry 4, and the other end of the second wire segment 782 connects the first surface 51 of the metal sheet 50. In addition, one end of the third wire segment 791 connects the bottom surface of the first circuitry 4, and the other end of the third wire segment 791 connects the first surface 51 of the metal sheet 50 through the bump portion 790. Similarly, one end of the fourth wire segment 792 connects the bottom surface of the first circuitry 4, and the other end of the fourth wire segment 792 connects the first surface 51 of the metal sheet 50.

Figure 58:
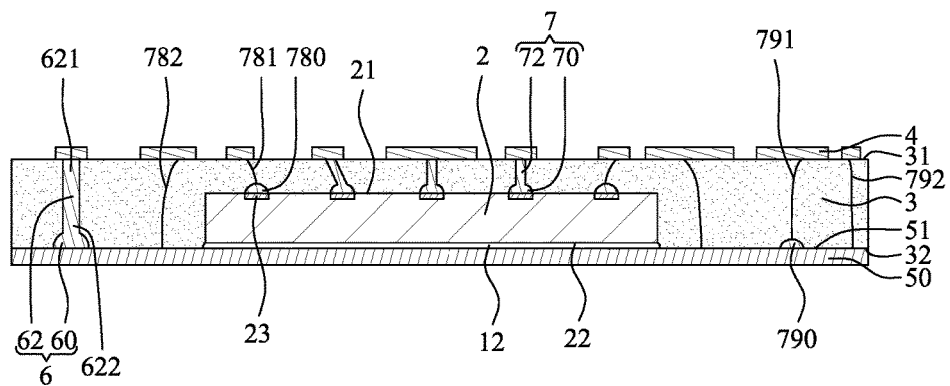
FIG. 58 depicts a cross-sectional view of an example semiconductor package at one or more stages during an example method for manufacturing a semiconductor package, according to some embodiments of the present disclosure.

Referring to FIG. 58, the carrier 53 is removed from the metal sheet 50. A sacrificial carrier may be attached on the top side to provide a desired strength for subsequent processing.

Then, the second circuitry 5 may be formed by the same stages as illustrated in FIGS. 38-40. The first protection layer 82 and the second protection layer 84 are formed so as to obtain the semiconductor package 1*i* as shown in FIG. 10.

Figure 59:
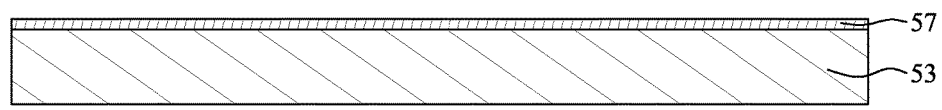
FIG. 59 depicts a cross-sectional view of an example semiconductor package at one or more stages during an example method for manufacturing a semiconductor package, according to some embodiments of the present disclosure.

FIGS. 59-62 depict cross-sectional views of an example semiconductor package at various stages during an example method for manufacturing the semiconductor package, according to some embodiments of the present disclosure. It is noted that the method disclosed in FIGS. 59-62 may be used to manufacture, e.g., the semiconductor package 1*j* of FIG. 11. Referring to FIG. 59, a carrier 53 with a metal layer 57 disposed on a surface of the carrier 53 is provided. The metal layer 57 may be the, e.g., metal sheet 50 of FIG. 31 or a seed layer.

Figure 60:
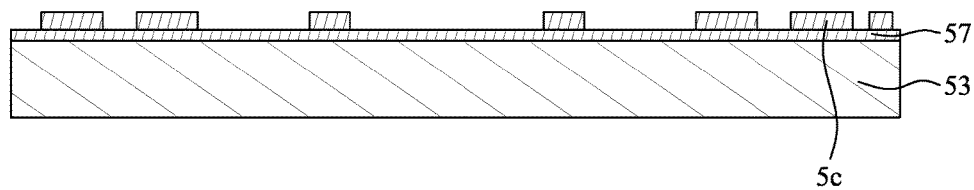
FIG. 60 depicts a cross-sectional view of an example semiconductor package at one or more stages during an example method for manufacturing a semiconductor package, according to some embodiments of the present disclosure.

Referring to FIG. 60, the second circuitry 5*c* is formed on the metal layer 57 by, for example, pattern plating.

Figure 61:
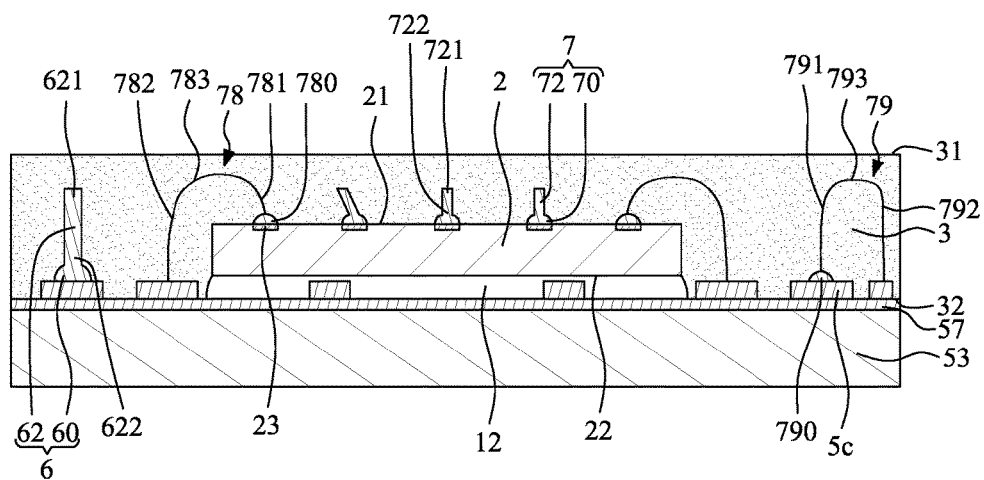
FIG. 61 depicts a cross-sectional view of an example semiconductor package at one or more stages during an example method for manufacturing a semiconductor package, according to some embodiments of the present disclosure.

Referring to FIG. 61, in a die face-up process, the backside surface 22 of the semiconductor element 2 is attached to the metal layer 57 on the carrier 53 by the adhesive layer 12. It is noted that the thickness of the adhesive layer 12 is greater than the thickness of the second circuitry 5*c* so as to prevent the semiconductor element 2 from contacting a portion of the second circuitry 5*c* that is disposed under the semiconductor element 2.

The first stud bump 6, the conductive interconnector (e.g., second stud bump 7), the single bonding wires 78, 79, and the encapsulant 3 are formed as shown in FIG. 55.

Figure 62:
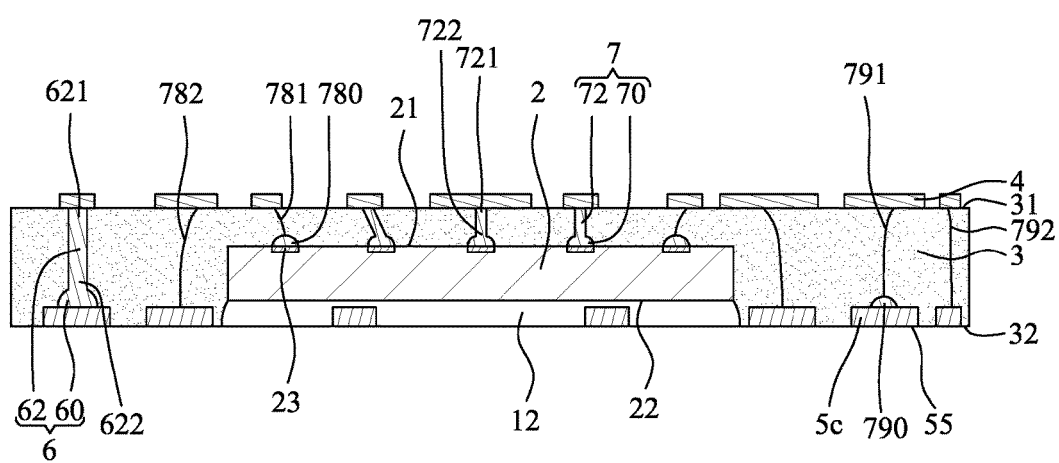
FIG. 62 depicts a cross-sectional view of an example semiconductor package at one or more stages during an example method for manufacturing a semiconductor package, according to some embodiments of the present disclosure.

Referring to FIG. 62, the encapsulant 3 is thinned as shown in FIG. 56. Then, the first circuitry 4 is formed on the first surface 31 of the encapsulant 3 as shown in FIG. 57. Then, the carrier 53 is removed from the metal layer 57. Then, the metal layer 57 or a portion of the metal layer 47 may be removed so that the second circuitry 5*c* is exposed from the second surface 32 of the encapsulant 3. The first protection layer 82 and the second protection layer 84 are formed so as to obtain the semiconductor package 1*j* as shown in FIG. 11.

As used herein, the singular terms "a," "an," and "the" may include plural referents unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 µm, no greater than 2 µm, no greater than 1 µm, or no greater than 0.5 µm. Two surfaces and/or objects can be deemed to be substantially perpendicular if an angle between the two surfaces and/or objects is from 80 degrees to 100 degrees, from 85 degrees to 95 degrees, from 88 degrees to 92 degrees, or from 89 degrees to 91 degrees.

In the description of some embodiments, a component provided "on," "above," or "on top of" another component can encompass cases where the former component is directly on (e.g., in physical or direct contact with) the latter component, as well as cases where one or more intervening components are located between the former component and the latter component.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package, comprising:
    at least one semiconductor element;
    an encapsulant covering at least a portion of the at least one semiconductor element, the encapsulant having a first surface and a second surface opposite to the first surface;
    a first circuitry disposed adjacent to the first surface of the encapsulant;
    a second circuitry disposed adjacent to the second surface of the encapsulant; and
    at least one first stud bump disposed in the encapsulant, and electrically connecting the first circuitry and the second circuitry, wherein the first stud bump contacts the second circuitry directly and protrudes from the first surface of the encapsulant.

2. The semiconductor package according to claim 1, wherein the at least one semiconductor element has an active surface and a backside surface opposite to the active surface, the active surface faces the first surface of the encapsulant, and the backside surface is disposed adjacent to the second surface of the encapsulant.

3. The semiconductor package according to claim 2, wherein the active surface of the at least one semiconductor element faces the first circuitry.

4. The semiconductor package according to claim 2, further comprising an adhesive layer disposed on the backside surface of the at least one semiconductor element.

5. The semiconductor package according to claim 1, wherein the at least one semiconductor element has an active surface and a backside surface opposite to the active surface, the active surface faces the second surface of the encapsulant, and the backside surface is disposed adjacent to the first surface of the encapsulant.

6. The semiconductor package according to claim 5, wherein the active surface of the at least one semiconductor element faces the second circuitry.

7. The semiconductor package according to claim 1, wherein the second circuitry is formed from a metal sheet.

8. The semiconductor package according to claim 1, wherein the second circuitry includes a base layer and a surface layer, the base layer is interposed between the second surface of the encapsulant and the surface layer, and the base layer is formed from a metal sheet.

9. The semiconductor package according to claim 1, wherein the second circuitry is a single layer having a monolithic structure.

10. The semiconductor package according to claim 1, wherein the second circuitry is embedded in the encapsulant, and at least a portion of the second circuitry is exposed from the encapsulant.

11. The semiconductor package according to claim 1, wherein the second circuitry has a first surface contacting the second surface of the encapsulant, and a surface roughness (Rz) of the first surface of the second circuitry is about 1.0 µm to about 3.0 µm.

12. The semiconductor package according to claim 1, wherein the second circuitry has a first surface contacting the second surface of the encapsulant, an uniformity of the first surface of the second circuitry is less than about 3%, and a total thickness variation (TTV) of the first surface of the second circuitry is less than about 5 µm.

13. The semiconductor package according to claim 1, further comprising at least one conductive interconnector electrically connecting the at least one semiconductor element and the first circuitry.

14. The semiconductor package according to claim 13, wherein the conductive interconnector includes at least one second stud bump, conductive pillar or bonding wire.

15. The semiconductor package according to claim 13, an acute angle is formed between the conductive interconnector and the at least one semiconductor element.

16. The semiconductor package according to claim 1, further comprising at least one conductive interconnector electrically connecting the at least one semiconductor element and the second circuitry.

17. The semiconductor package according to claim 1, further comprising a first wire segment and a second wire segment, wherein the first wire segment electrically connects the first circuitry and the at least one semiconductor element, the second wire segment electrically connects first circuitry and the second circuitry, and the first wire segment and the second wire segment are separated and are formed from a single bonding wire.

18. The semiconductor package according to claim 17, further comprising a third wire segment and a fourth wire segment, wherein the third wire segment and the fourth wire segment electrically connect the first circuitry and the second circuitry, and the third wire segment and the fourth wire segment are separated and are formed from a single bonding wire.

19. The semiconductor package according to claim 1, wherein the first circuitry is disposed on the first surface of the encapsulant, and the second circuitry is disposed on the second surface of the encapsulant.

20. The semiconductor package according to claim 1, further comprising at least one bonding wire electrically connecting the at least one semiconductor element and the second circuitry.

21. The semiconductor package according to claim 1, wherein the first stud bump includes a stud portion and a bump portion, a width of the stud portion is smaller than a width of the bump portion, the bump portion contacts the second circuitry, one end of the stud portion connects the bump portion, and the other end of the stud portion contacts the first circuitry.

22. The semiconductor package according to claim 1, further comprising a heat sink attached to the at least one semiconductor element.

23. The semiconductor package according to claim 1, wherein the first stud bump includes a stud portion and a bump portion, and the stud portion and the bump portion are formed integrally.

24. A semiconductor package, comprising:
at least one semiconductor element having an active surface and a backside surface opposite to the active surface;
an adhesive layer disposed on the backside surface of the at least one semiconductor element;
an encapsulant covering at least a portion of the at least one semiconductor element, the encapsulant having a first surface and a second surface opposite to the first surface, wherein the active surface of the at least one semiconductor element faces the first surface of the encapsulant, and the backside surface of the at least one semiconductor element is disposed adjacent to the second surface of the encapsulant;
a first circuitry disposed adjacent to the first surface of the encapsulant;
a second circuitry disposed adjacent to the second surface of the encapsulant and electrically connected to the first circuitry;
a top semiconductor element disposed above the at least one semiconductor element;
a top encapsulant covering at least a portion of the top semiconductor element; and
a third circuitry disposed on the top encapsulant and electrically connected to the first circuitry.

25. The semiconductor package according to claim 24, further comprising:
at least one first stud bump disposed in the encapsulant and electrically connecting the first circuitry and the second circuitry.

26. The semiconductor package according to claim 24, wherein the second circuitry includes a base layer and a surface layer disposed on the base layer.

27. The semiconductor package according to claim 24, further comprising:
at least one bottom semiconductor element disposed under the at least one semiconductor element;
a bottom encapsulant covering at least a portion of the bottom semiconductor element; and
a fourth circuitry disposed on the bottom encapsulant and electrically connected to the second circuitry.

28. The semiconductor package according to claim 27, wherein the bottom encapsulant contacts the encapsulant.

29. The semiconductor package according to claim 27, wherein at least a portion of the second circuitry is embedded in the bottom encapsulant.

30. The semiconductor package according to claim 27, further comprising:
at least one first stud bump disposed in the encapsulant, and electrically connecting the first circuitry and the second circuitry; and
at least one third stud bump disposed in the bottom encapsulant, and electrically connecting the fourth circuitry and the second circuitry.

31. The semiconductor package according to claim 24, wherein the top encapsulant contacts the encapsulant.

32. The semiconductor package according to claim 24, wherein at least a portion of the first circuitry is embedded in the top encapsulant.

33. The semiconductor package according to claim 24, further comprising:
at least one first stud bump disposed in the encapsulant, and electrically connecting the first circuitry and the second circuitry; and
at least one fifth stud bump disposed in the top encapsulant, and electrically connecting the third circuitry and the first circuitry.

34. The semiconductor package according to claim 24, wherein the at least one semiconductor element includes a plurality of stacked semiconductor elements.

35. The semiconductor package according to claim 24, wherein the second circuitry includes a base layer formed from a metal sheet.

* * * * *